US009824957B2

(12) United States Patent
Saito

(10) Patent No.: US 9,824,957 B2
(45) Date of Patent: Nov. 21, 2017

(54) SEMICONDUCTOR DEVICE AND METHOD FOR MANUFACTURING THE SAME

(71) Applicant: ROHM CO., LTD., Kyoto (JP)

(72) Inventor: Koshun Saito, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 14/570,601

(22) Filed: Dec. 15, 2014

(65) Prior Publication Data

US 2015/0097279 A1    Apr. 9, 2015

Related U.S. Application Data

(63) Continuation of application No. 13/346,826, filed on Jan. 10, 2012, now Pat. No. 8,921,985.

(30) Foreign Application Priority Data

Jan. 11, 2011  (JP) ................................. 2011-002707

(51) Int. Cl.
*H01L 23/495* (2006.01)
*H01L 21/56* (2006.01)
(Continued)

(52) U.S. Cl.
CPC ........ *H01L 23/49548* (2013.01); *H01L 21/56* (2013.01); *H01L 21/568* (2013.01); *H01L 23/3114* (2013.01); *H01L 23/495* (2013.01); *H01L 23/49524* (2013.01); *H01L 23/49541* (2013.01); *H01L 23/49562* (2013.01); *H01L 24/40* (2013.01); *H01L 24/73* (2013.01); *H01L 24/92* (2013.01); *H01L 24/97* (2013.01); *H01L 23/29* (2013.01); *H01L 24/06* (2013.01); *H01L 24/13* (2013.01); *H01L 24/16* (2013.01); *H01L 24/27* (2013.01); *H01L 24/29* (2013.01); *H01L 24/32* (2013.01); *H01L 2224/0401* (2013.01);
(Continued)

(58) Field of Classification Search
CPC ......... H01L 23/49589; H01L 23/49805; H01L 23/49838; H01L 23/49861
See application file for complete search history.

(56) References Cited

U.S. PATENT DOCUMENTS 6,566,749 B1    5/2003  Joshi et al.
6,784,537 B2 *  8/2004  Moriguchi .......... H01L 23/3107
                                                    257/675
(Continued)

FOREIGN PATENT DOCUMENTS

JP        2003-068958        3/2003

*Primary Examiner* — Eduardo A Rodela
(74) *Attorney, Agent, or Firm* — Hamre, Schumann, Mueller & Larson, P.C.

(57) ABSTRACT

A semiconductor device includes: a semiconductor chip including a main surface electrode; a first mounting lead; a second mounting lead; a connection lead which overlaps with the main surface electrode, the first mounting lead and the second mounting lead when viewed in a thickness direction of the semiconductor chip and makes electrical conduction between the main surface electrode, the first mounting lead and the second mounting lead; and a resin portion which covers the semiconductor chip, the first mounting lead and the second mounting lead, wherein the resin portion has a resin bottom lying on the same plane as a bottom of the first mounting lead and a bottom of the second mounting lead.

7 Claims, 43 Drawing Sheets

(51) Int. Cl.
*H01L 23/31* (2006.01)
*H01L 23/29* (2006.01)
*H01L 23/00* (2006.01)

(52) U.S. Cl.
CPC ........... *H01L 2224/06181* (2013.01); *H01L 2224/131* (2013.01); *H01L 2224/13139* (2013.01); *H01L 2224/16245* (2013.01); *H01L 2224/27003* (2013.01); *H01L 2224/29111* (2013.01); *H01L 2224/29113* (2013.01); *H01L 2224/29116* (2013.01); *H01L 2224/29139* (2013.01); *H01L 2224/32225* (2013.01); *H01L 2224/32245* (2013.01); *H01L 2224/40095* (2013.01); *H01L 2224/40247* (2013.01); *H01L 2224/48091* (2013.01); *H01L 2224/48247* (2013.01); *H01L 2224/73253* (2013.01); *H01L 2224/73263* (2013.01); *H01L 2224/73265* (2013.01); *H01L 2224/92225* (2013.01); *H01L 2224/92255* (2013.01); *H01L 2224/97* (2013.01); *H01L 2924/01029* (2013.01); *H01L 2924/14* (2013.01); *H01L 2924/157* (2013.01); *H01L 2924/1532* (2013.01); *H01L 2924/15151* (2013.01); *H01L 2924/15153* (2013.01); *H01L 2924/181* (2013.01); *H01L 2924/18161* (2013.01)

(56) References Cited

U.S. PATENT DOCUMENTS

| | | | |
|---|---|---|---|
| 6,812,554 B2 | 11/2004 | Hirashima et al. | |
| 6,876,087 B2 | 4/2005 | Ho et al. | |
| 6,992,386 B2* | 1/2006 | Hata | H01L 23/49562 257/276 |
| 7,215,011 B2 | 5/2007 | Joshi et al. | |
| 7,855,439 B2 | 12/2010 | Liu | |
| 7,985,991 B2* | 7/2011 | Kajiwara et al. | 257/268 |
| 8,283,772 B1* | 10/2012 | Gamboa | H01L 23/49548 257/666 |
| 8,314,499 B2 | 11/2012 | Liu | |
| 8,319,323 B2 | 11/2012 | Letterman, Jr. et al. | |
| 8,410,590 B2 | 4/2013 | Otremba | |
| 2002/0071253 A1 | 6/2002 | Lam et al. | |
| 2002/0130397 A1 | 9/2002 | Yew et al. | |
| 2003/0009295 A1 | 1/2003 | Markowitz et al. | |
| 2004/0063240 A1* | 4/2004 | Madrid | H01L 23/49524 438/106 |
| 2009/0115035 A1* | 5/2009 | Bayan | H01L 23/4951 257/673 |
| 2009/0236714 A1 | 9/2009 | Cabahug et al. | |

* cited by examiner

FIG. 1
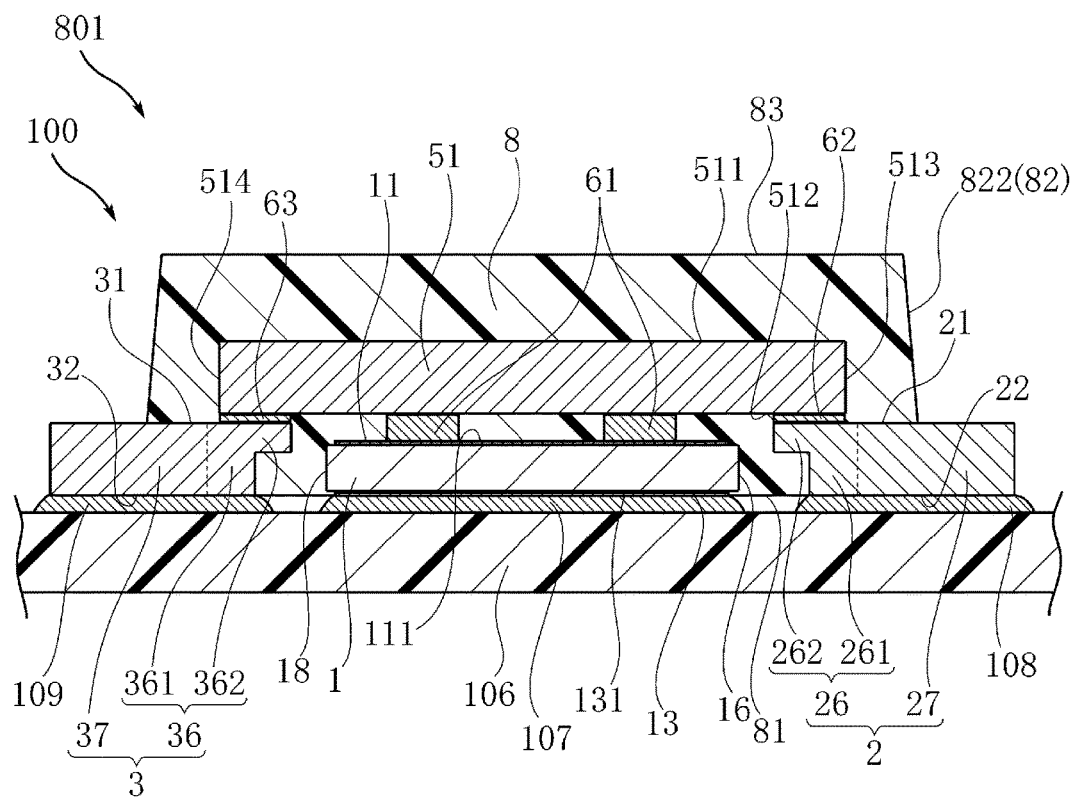
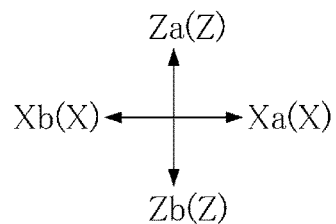

FIG. 6
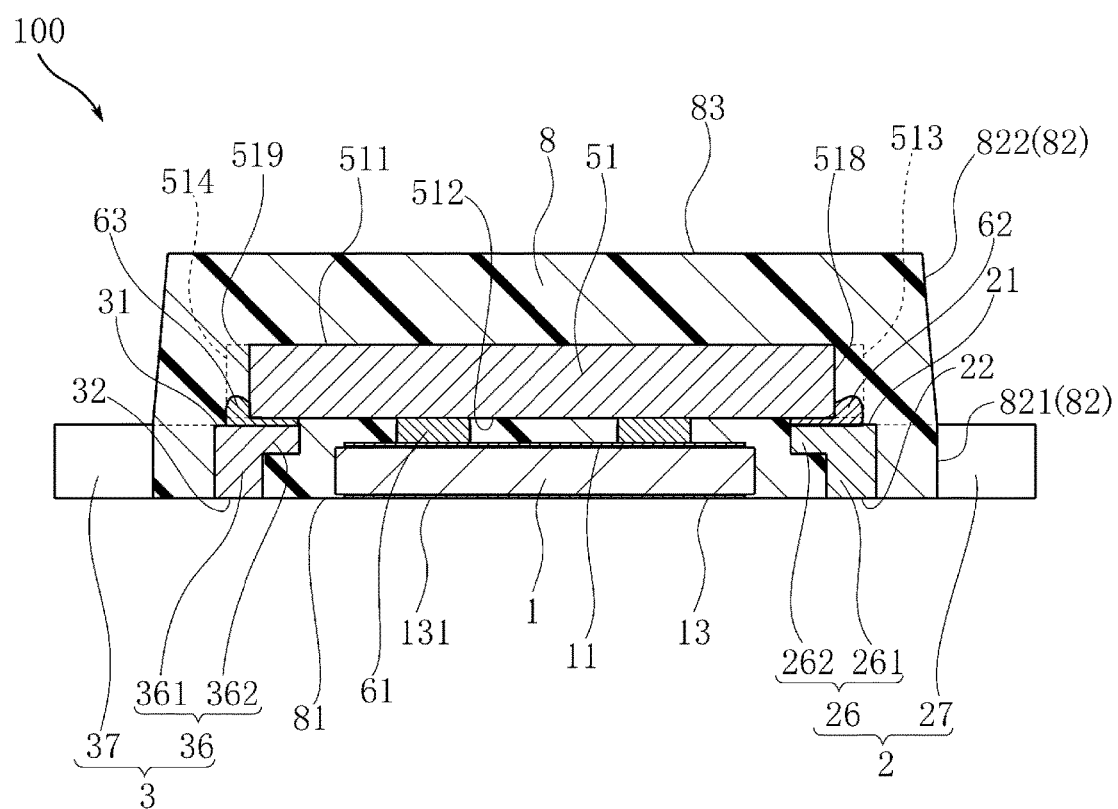
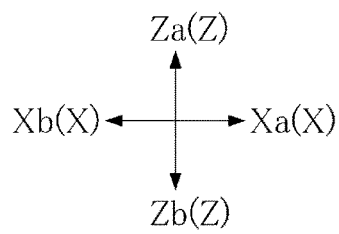

FIG. 7
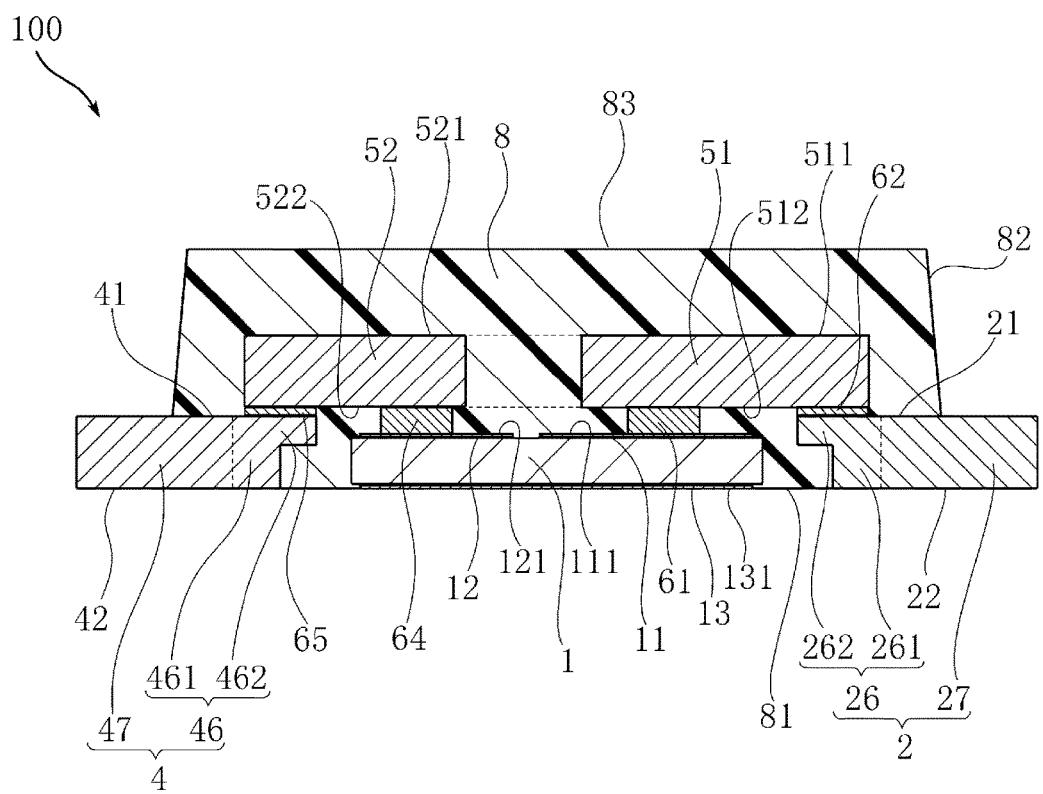
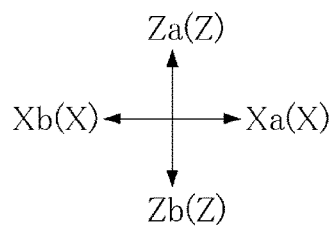

FIG. 22
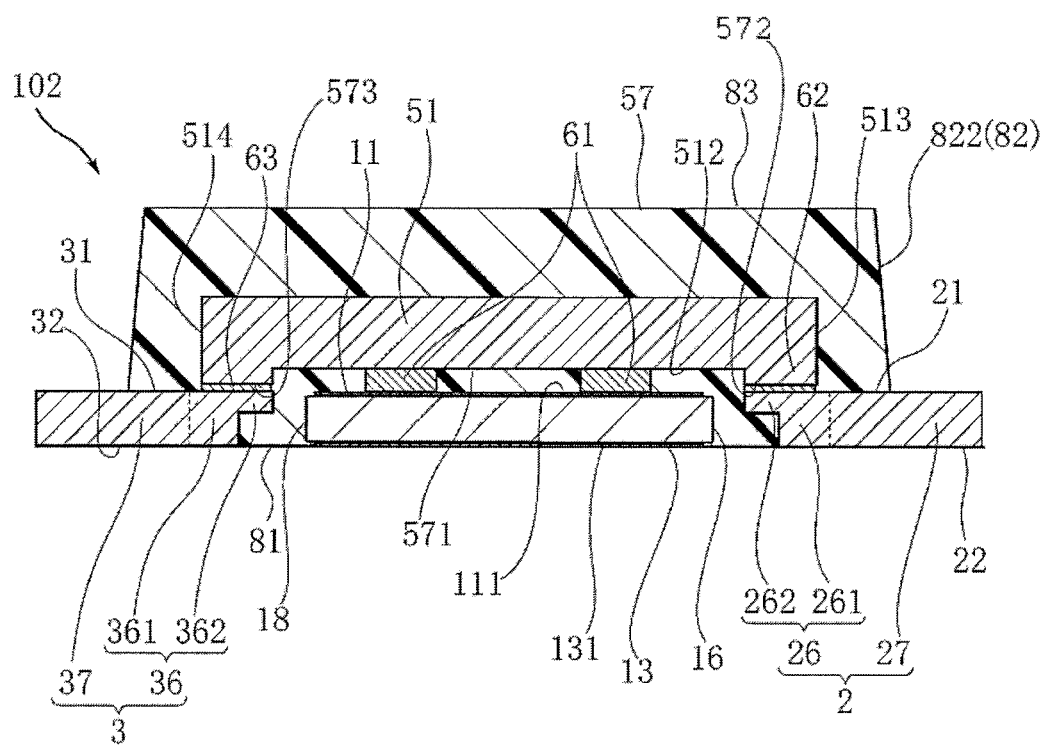
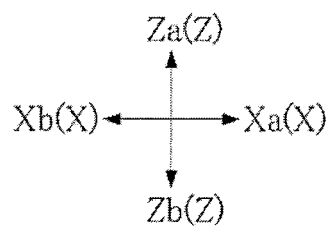

FIG. 24
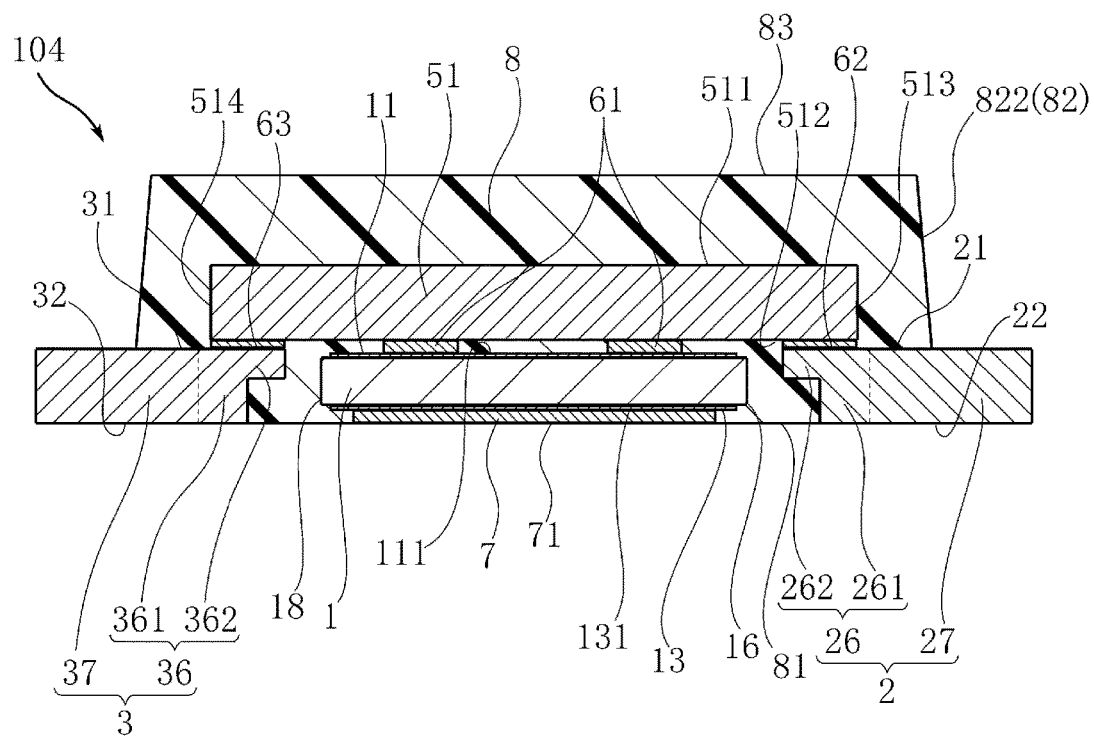
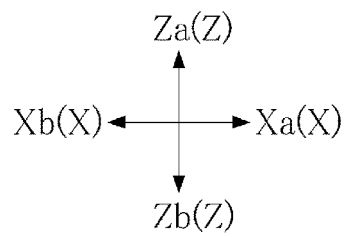

FIG. 30
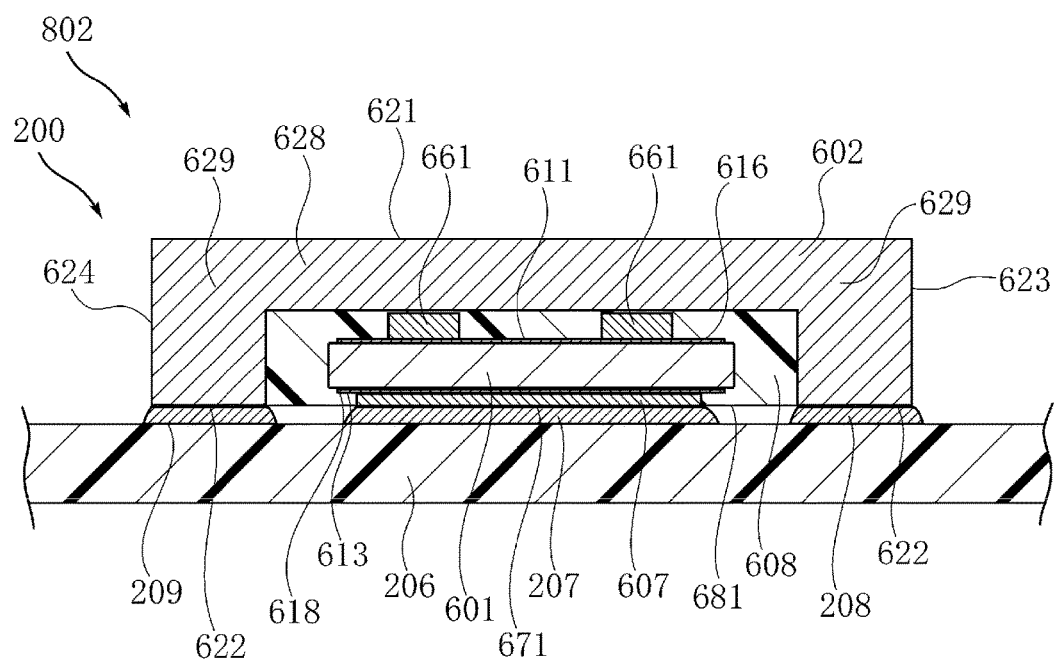
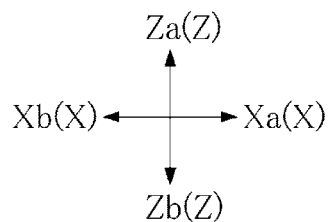

FIG. 32
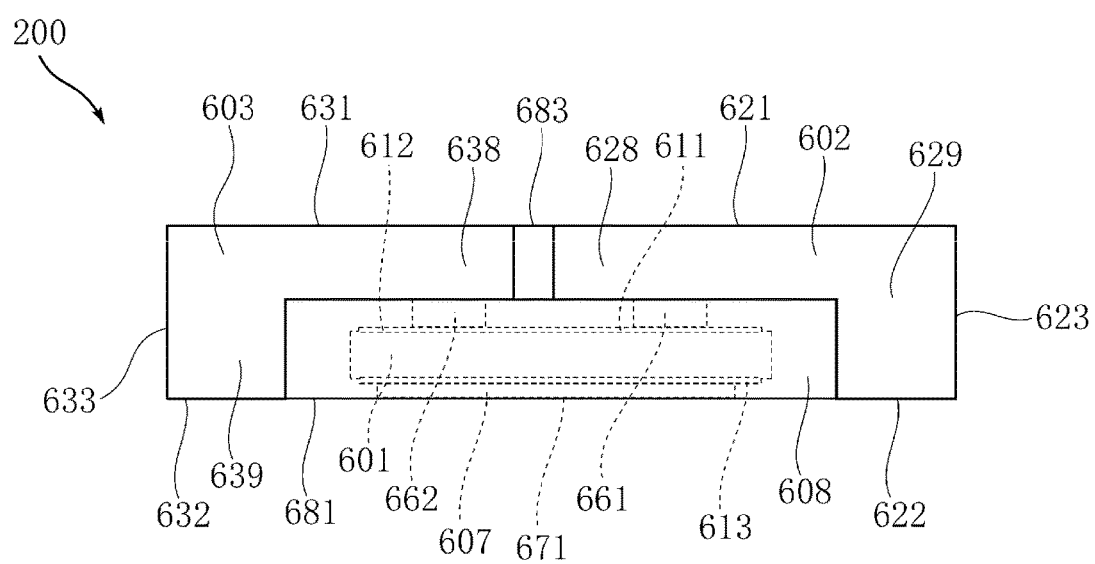
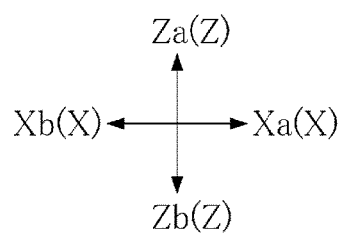

FIG. 38
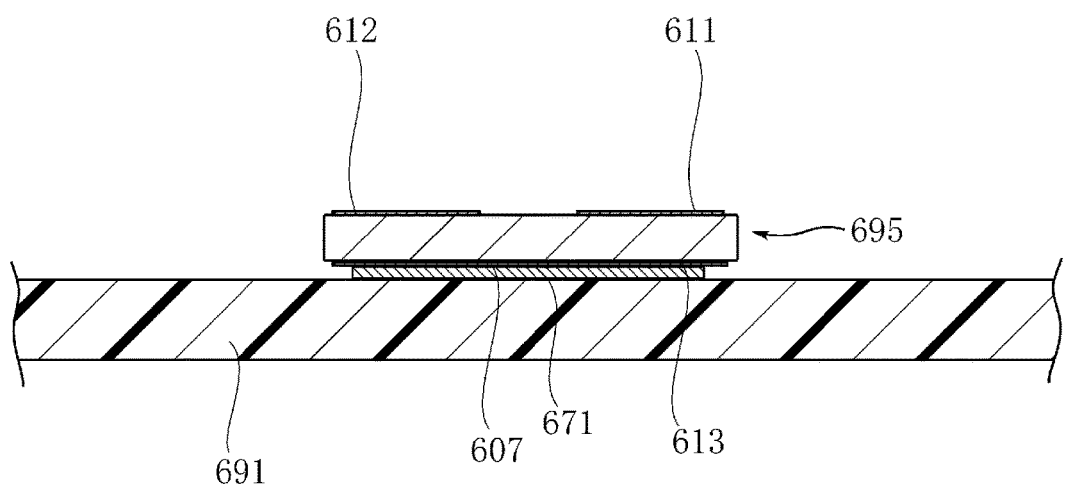
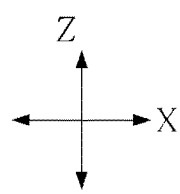

SEMICONDUCTOR DEVICE AND METHOD FOR MANUFACTURING THE SAME

CROSS-REFERENCE TO RELATED APPLICATION

This application is a Continuation of application Ser. No. 13/346,826, filed Jan. 10, 2012, which is based upon and claims the benefit of priority from Japan Patent Application No. 2011-2707, filed on Jan. 11, 2011, the entire contents of which are incorporated herein by reference.

TECHNICAL FIELD

The present disclosure relates to a semiconductor device and a method for manufacturing the same.

BACKGROUND

FIG. 47 is a sectional view showing a conventional semiconductor device. As shown in FIG. 47, a semiconductor device 901 includes a discrete element 921, a terminal 922 of a lead frame, a die pad 923, a solder layer 924, a wire 925 and a mold resin 926. An example of the discrete element 921 may include a transistor. The terminal 922 and the die pad 923 may be made of metal. The solder layer 924 bonds the discrete layer 921 to the die pad 923. The wire 925 is bonded to both the discrete element 921 and the terminal 922, thereby allowing electrical conduction between the discrete element 921 and the terminal 922. The mold resin 926 covers the discrete element 921, the terminal 922, the die pad 923, the solder layer 924 and the wire 925. A surface 928 of the terminal 922 and a surface 929 of the die pad 923 are exposed from the mold resin 926.

For the manufacture of the semiconductor device 901, the terminal 922 and the die pad 923 are first bonded to a heat resistant tape (not shown) for the prevention of resin burr. Next, the discrete element 921 is bonded to the die pad 923 through the solder layer 924. Next, the wire 925 is bonded to the discrete element 921 and the terminal 922. Next, with the terminal 922 and the die pad 923 bonded to the heat resistant tape, the terminal 922, the die pad 923, etc. are covered by the mold resin 926. Finally, the heat resistant tape is detached from the terminal 922 and the die pad 923, completing the semiconductor device 901. Japanese Patent Laid-open Publication No. 2003-68958 discloses such a conventional semiconductor device.

However, it was difficult to thin the semiconductor device 901 since the discrete element 921 is bonded to the die pad 923. FIG. 46 shows another semiconductor device developed for the purpose of its thinness. As shown in FIG. 46, a semiconductor device 900 includes a discrete element 911, a terminal 912 of a lead frame, a wire 915 and a mold resin 916. The semiconductor device 900 does not include a configuration corresponding to the die pad 923 and the solder layer 924 in the semiconductor device 901, and the discrete element 911 is exposed from the mold resin 916, thereby thinning the semiconductor device 900.

With recent compactness of electronics incorporating semiconductor devices, there is a strong need for more advanced miniaturization of semiconductor devices. There is also a strong need for higher efficient manufacture of semiconductor devices. However, the above-described semiconductor device 900 does not sufficiently meet such needs.

SUMMARY

In the light of the above circumstances, the present disclosure provides some embodiments of a semiconductor device and a method for manufacturing the same, which are adapted for miniaturization and efficient manufacture of semiconductor devices.

According to one embodiment of the present disclosure, there is provided a semiconductor device including: a semiconductor chip including a main surface electrode; a first mounting lead which is separated from the semiconductor chip in a direction perpendicular to a thickness direction of the semiconductor chip; a second mounting lead which is separated from the semiconductor chip in another direction perpendicular to the thickness direction; a connection lead which overlaps with the main surface electrode, the first mounting lead and the second mounting lead when viewed in the thickness direction and makes electrical conduction between the main surface electrode, the first mounting lead and the second mounting lead; and a resin portion which covers the semiconductor chip, the first mounting lead and the second mounting lead, wherein the first mounting lead has a first mounting lead bottom facing a first direction of the thickness direction, the first direction directing from the connection lead to the main surface electrode, the second mounting lead has a second mounting lead bottom facing the first direction, and the resin portion has a resin bottom lying on the same plane as the first mounting lead bottom and the second mounting lead bottom.

Preferably, the semiconductor chip includes a rear surface electrode exposed from the resin bottom.

Preferably, the semiconductor device further includes: a first conductive bonding which is located between the main surface electrode and the connection lead and bonds the main surface electrode to the connection lead; a second conductive bonding which is located between the first mounting lead and the connection lead and bonds the first mounting lead to the connection lead; and a third conductive bonding which is located between the second mounting lead and the connection lead and bonds the second mounting lead to the connection lead.

Preferably, the first mounting lead has a first mounting lead main surface facing the connection lead, and the first mounting lead main surface has a portion located at a side of the semiconductor chip other than the first mounting lead bottom when viewed in the thickness direction.

Preferably, the dimension of the first conductive bonding in the thickness direction is larger than any of the dimension of the second conductive bonding in the thickness direction and the dimension of the third conductive bonding in the thickness direction.

Preferably, the resin portion has a resin side surrounding the semiconductor chip when viewed in the thickness direction, and the first mounting lead is exposed from the resin side.

Preferably, the resin side surrounds the connection lead.

Preferably, the resin side has an inclined portion to make an acute angle with the resin bottom with respect to the thickness direction.

Preferably, the semiconductor chip is located between the first mounting lead and the second mounting lead.

Preferably, the connection lead has a connection lead main surface which faces an opposite direction to the first direction, and the connection lead main surface is covered with the resin portion.

Preferably, the connection lead has a connection lead main surface which faces an opposite direction to the first direction, and the connection lead main surface is exposed from the resin portion.

Preferably, the connection lead has a U-like section.

Preferably, the first mounting lead projects from the resin side.

Preferably, the first mounting lead further has a mounting lead side lying on the same plane as the resin side.

Preferably, the semiconductor device further includes a conductive layer exposed from the resin bottom, wherein the semiconductor chip includes a rear surface electrode having an electrode surface extending in the first direction and making direct contact with the conductive layer.

Preferably, the semiconductor chip projects from the conductive layer when viewed in the thickness direction.

Preferably, the area of the conductive layer when viewed in the thickness direction is smaller than the area of the semiconductor chip when viewed in the thickness direction.

Alternatively, the area of the conductive layer when viewed in the thickness direction is larger than the area of the semiconductor chip when viewed in the thickness direction.

According to another embodiment of the present disclosure, there is provided a method for manufacturing a semiconductor device, including: bonding a first mounting lead and a second mounting lead to a tape; placing a semiconductor chip at a position at which the semiconductor chip overlaps with the first mounting lead and the second mounting lead in a thickness direction of the semiconductor chip; bonding a connection lead to the semiconductor chip, the first mounting lead and the second mounting lead; and covering the semiconductor chip, the first mounting lead and the second mounting lead with a resin portion.

According to another embodiment of the present disclosure, there is provided a semiconductor device including: a semiconductor chip including a main surface electrode having a first electrode surface facing a first direction and a rear surface electrode having a second electrode surface facing a second direction opposite the first direction; a lead having a portion overlapping with the semiconductor chip in the first direction; a conductive bonding which is located between the first electrode surface and the lead and bonds the first electrode surface to the lead; a conductive layer which makes direct contact with the second electrode surface; and a resin portion which covers the semiconductor chip, the lead and the conductive layer, wherein the lead has a lead bottom which faces the second direction and is exposed from the resin portion, and the conductive layer is exposed from the resin portion.

Preferably, the semiconductor chip projects from the conductive layer when viewed in the second direction.

Preferably, an area of the conductive layer when viewed in the second direction is smaller than an area of the semiconductor chip when viewed in the second direction.

Alternatively, an area of the conductive layer when viewed in the second direction is larger than an area of the semiconductor chip when viewed in the second direction.

Other features and advantages of the present disclosure will be apparent from the following detailed description in conjunction with the accompanying drawings.

BRIEF DESCRIPTION OF THE DRAWINGS

FIG. 1 is a main part sectional view showing a mount structure of a semiconductor device according to a first embodiment.

FIG. 6 is a sectional view taken along line VI-VI in FIG. 2.

FIG. 7 is a sectional view taken along line VII-VII in FIG. 2.

FIG. 22 is a sectional view of the semiconductor device according to a second modification of the first embodiment.

FIG. 24 is a sectional view of the semiconductor device according to a fourth modification of the first embodiment.

FIG. 30 is a sectional view showing a mount structure of a semiconductor device according to a second embodiment.

FIG. 32 is a front view of the semiconductor device shown in FIG. 31.

FIG. 38 is a main part sectional view taken along line XXXVIII-XXXVIII in FIG. 37.

DETAILED DESCRIPTION

Embodiments of the present disclosure will now be described in detail with reference to the drawings.
<First Embodiment>

FIG. 1 is a main part sectional view showing a mount structure of a semiconductor device according to a first embodiment of the present disclosure.

As shown in FIG. 1, a mount structure 801 includes a semiconductor device 100, a circuit board 106 and solder layers 107 to 109.

An example of the circuit board 106 may include a printed circuit board. The circuit board 106 includes, for example, an insulating substrate (not shown) and patterned electrodes (not shown) formed on the insulating substrate. The semiconductor device 100 is mounted on the circuit board 106. The solder layers 107 to 109 are interposed between the semiconductor device 100 and the circuit board 106. The solder layers 107 to 109 connect the semiconductor device 100 and the circuit board 106.

Figure 2:
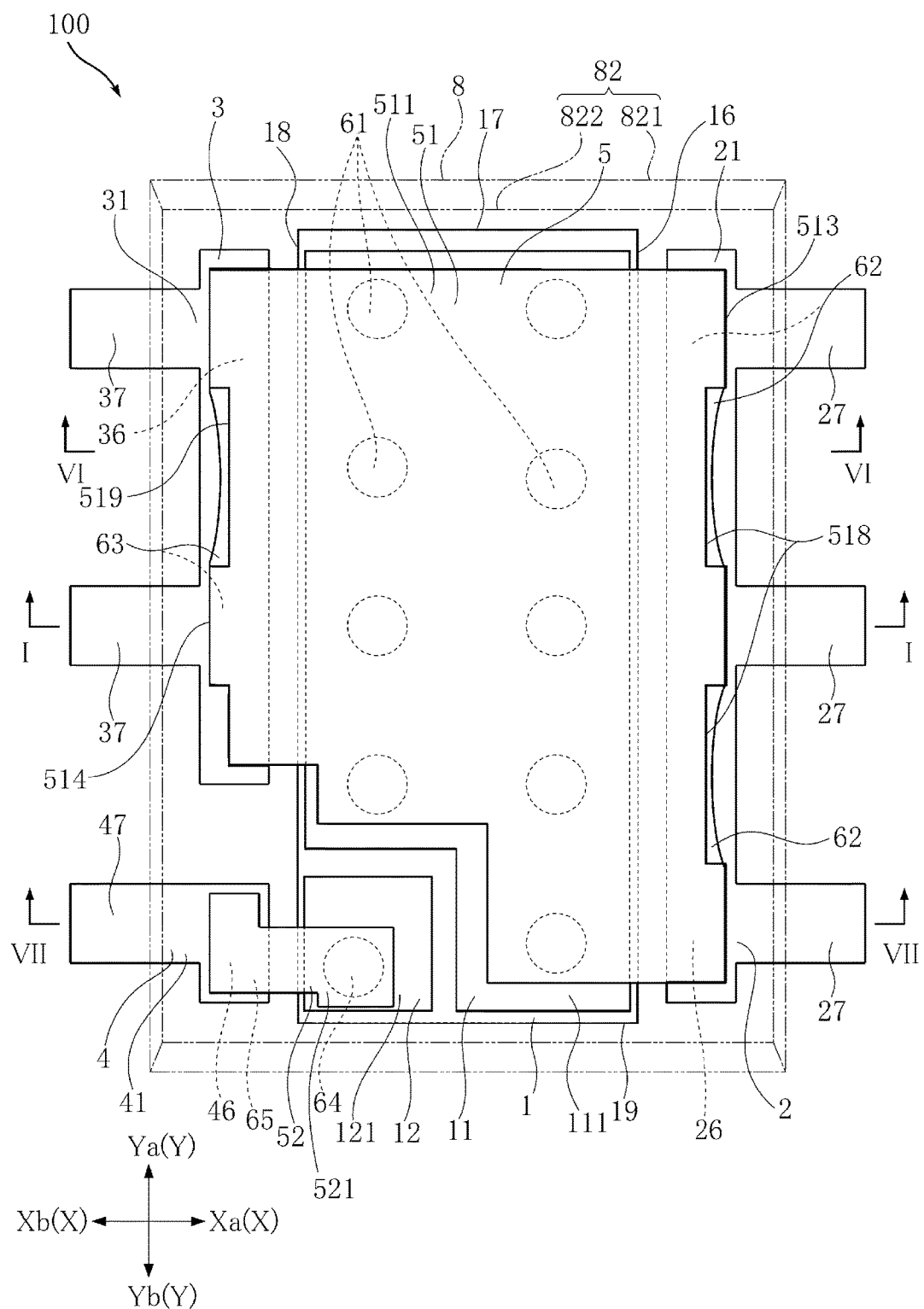
FIG. 2 is a plan view (partially omitted and partially shown transparently) of the semiconductor device shown in FIG. 1.
Figure 3:
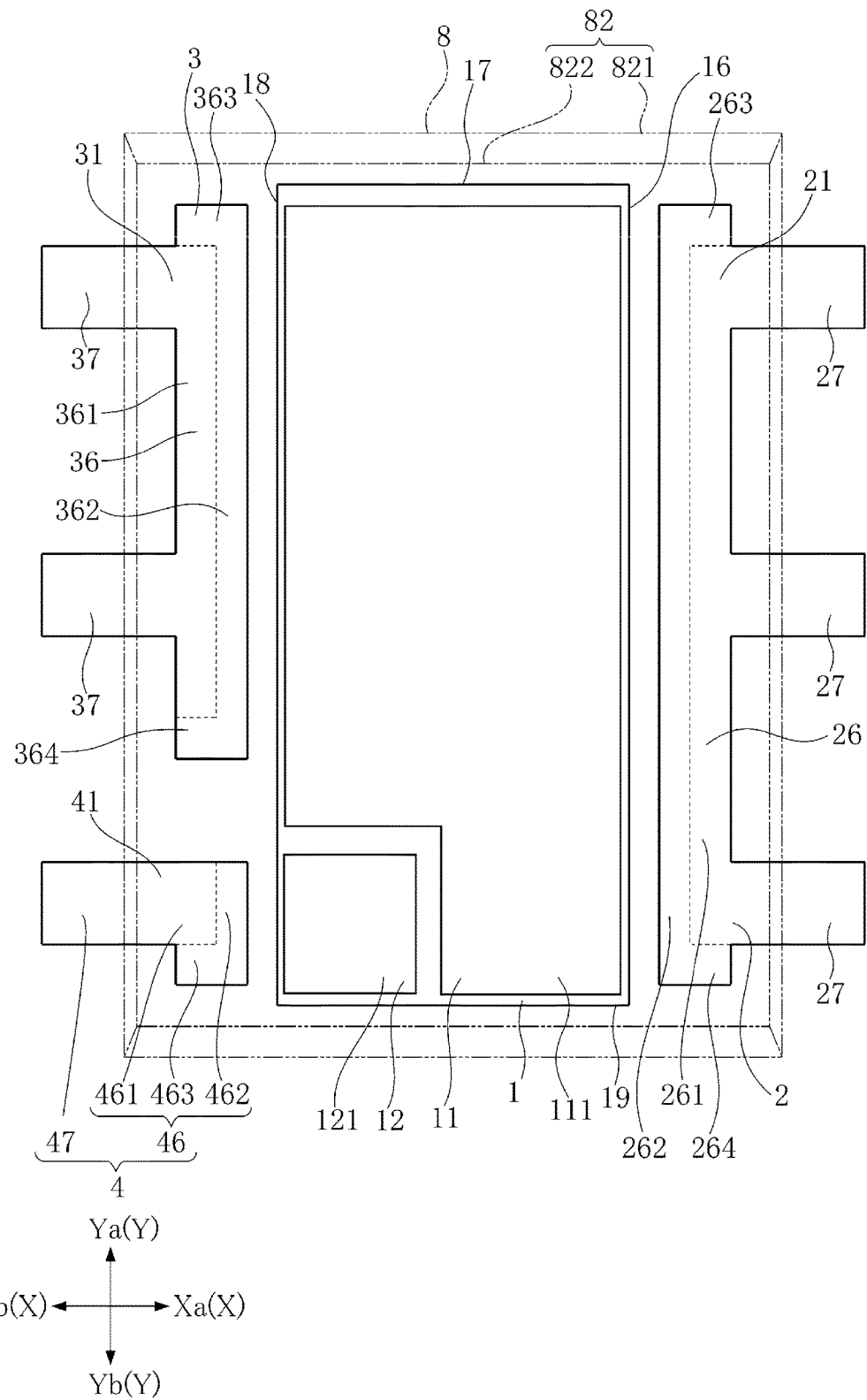
FIG. 3 is a plan view (partially shown transparently) in which connection leads and conductive bondings shown in FIG. 2 are omitted.
Figure 4:
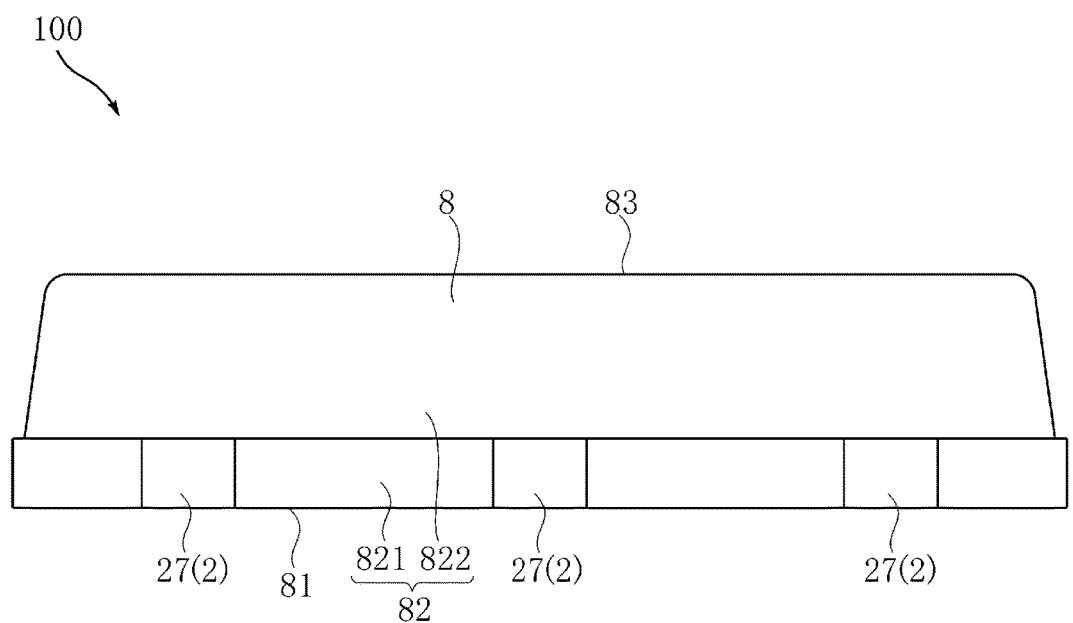
FIG. 4 is a right side view of the semiconductor device shown in FIG. 2.
Figure 5:
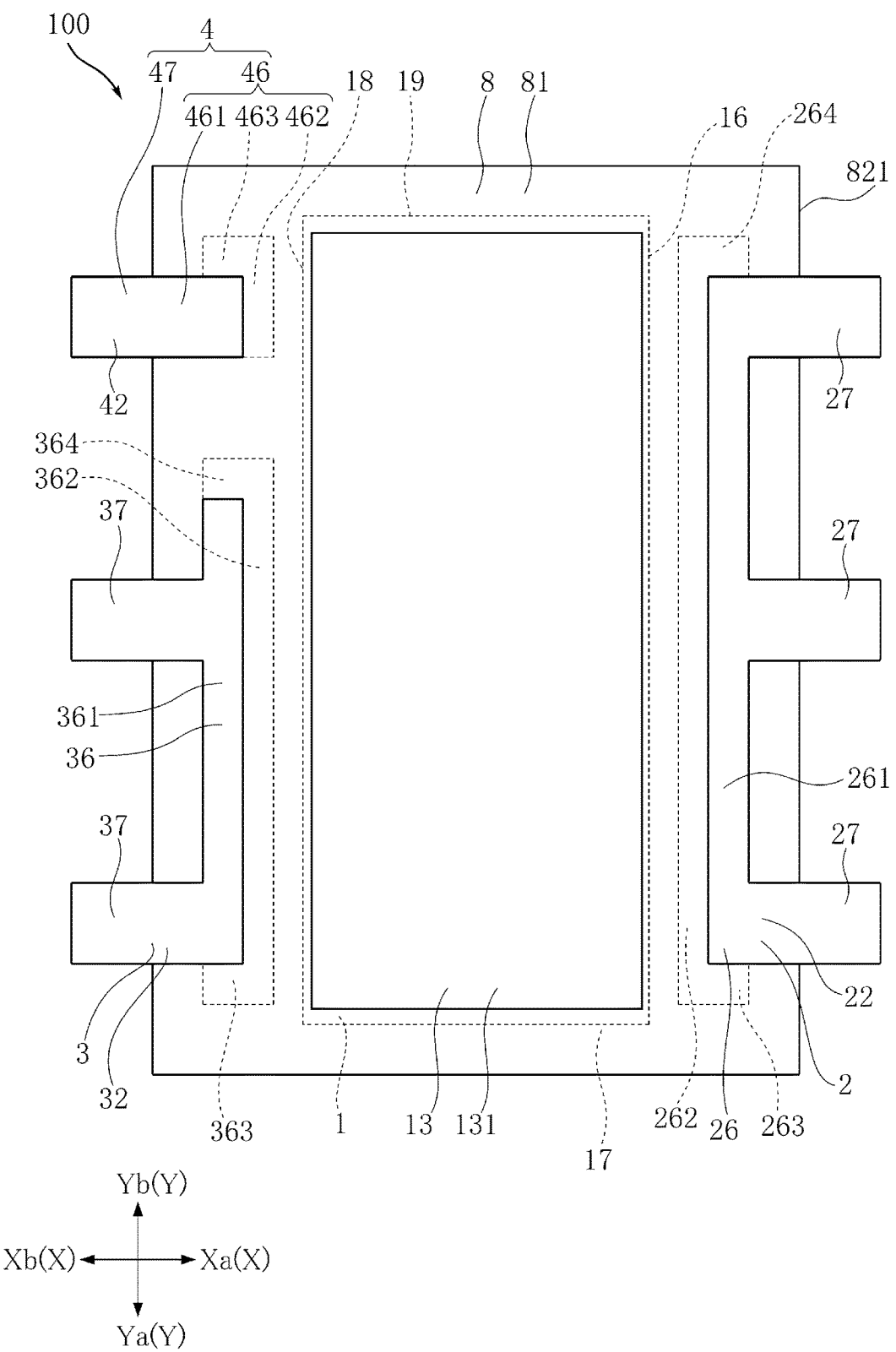
FIG. 5 is a bottom view (partially shown transparently) of the semiconductor device shown in FIG. 2.

FIG. 2 is a plan view (partially omitted and partially shown transparently) of the semiconductor device shown in FIG. 1. FIG. 3 is a plan view (partially shown transparently) in which the connection leads and the conductive bondings shown in FIG. 2 are omitted. FIG. 4 is a right side view of the semiconductor device shown in FIG. 2. FIG. 5 is a bottom view (partially shown transparently) of the semiconductor device shown in FIG. 2. FIG. 6 is a sectional view taken along line VI-VI in FIG. 2. FIG. 7 is a sectional view taken along line VII-VII in FIG. 2. In FIGS. 2 and 3, a resin portion 8 is indicated by an imaginary line. FIG. 1 shows a sectional view of the semiconductor device 100, which is taken along line I-I in FIG. 2.

The semiconductor device 100 shown in these figures includes a semiconductor chip 1, mounting leads 2 to 4, connection leads 51 and 52, conductive bondings 61 to 65 and a resin portion 8.

The semiconductor chip 1 shown in FIGS. 1 to 3 and FIGS. 5 to 7 is a device made of a semiconductor. An example of the semiconductor chip 1 may include a diode, a transistor and an integrated circuit (IC). In this embodiment, the semiconductor chip 1 is a transistor. As shown in FIGS. 2 and 3, the semiconductor chip 1 has a rectangular shape when viewed from above. The semiconductor chip 1 has chip sides 16 to 19. The chip side 16 has a planar shape widened in a YZ plane and faces one of directions X (hereinafter referred to as "direction Xa"). The chip side 17 has a planar shape widened in a ZX plane and faces one of directions Y (hereinafter referred to as "direction Ya"). The chip side 18 has a planar shape widened in the YZ plane and faces the other of directions X (hereinafter referred to as "direction Xb"). The chip side 19 has a planar shape widened in the ZX plane and faces the other of directions Y (hereinafter referred to as "direction Yb"). The chip side 16, the chip side 17, the chip side 18 and the chip side 19 are connected to the chip side 17, the chip side 18, the chip side 19 and the chip side 16, respectively. Thickness (the dimension in the direction Z) of the semiconductor chip 1 is, for example, 200 μm. The dimension in the direction X of the semiconductor chip 1 is, for example, 2000 μm. The dimension in the direction Y of the semiconductor chip 1 is, for example, 4000 μm.

As shown in FIGS. 3, 5 and 7, the semiconductor chip 1 includes main surface electrodes 11 and 12 and a rear surface electrode 13. The main surface electrode 11 has an electrode surface 111. The main surface electrode 12 has an electrode surface 121. The electrode surfaces 111 and 112 face one of the thickness directions Z of the semiconductor chip 1 (hereinafter referred to as "direction Za"). The rear surface electrode 13 has an electrode surface 131. The electrode surface 131 faces the other of the thickness directions Z of the semiconductor chip 1 (hereinafter referred to as "direction Zb").

In this embodiment, the main surface electrode 11 is a source electrode, the main surface electrode 12 is a gate electrode and the rear surface electrode 13 is a drain electrode. As an alternative embodiment, the main surface electrode 11 in the semiconductor chip 1 may be, for example, a drain electrode or the like. If the semiconductor chip 1 is a diode, the semiconductor chip 1 may not include the main surface electrode 12 (that is, may include only the main surface electrode 11 mentioned in this embodiment). If the semiconductor chip 1 is an IC, the semiconductor chip 1 may include more main surface electrodes in addition to the above-mentioned two main surface electrodes 11 and 12. Even if the semiconductor chip 1 is a transistor, the semiconductor chip 1 may not necessarily include the rear surface electrode 13. In this case, the semiconductor chip 1 may include three main surface electrodes.

The mounting leads 2 to 4 shown in FIGS. 1 to 7 are used to mount the semiconductor device 100 on the circuit board 106. The mounting leads 2 to 4 are made of a conductor such as, for example, copper. The mounting leads 2 and 3 make electrical conduction with the main surface electrode 11 and the mounting lead 4 makes electrical conduction with the main surface electrode 12. As shown in FIGS. 1, 3 and 7, the mounting leads 2 to 4 and the semiconductor chip 1 are arranged at different positions when viewed in the direction Z. The mounting leads 2 to 4 partially overlap with the semiconductor chip 1 in the direction Z. That is, the mounting leads 2 to 4 are separated from the semiconductor chip 1 in one of the directions perpendicular to the thickness direction Z of the semiconductor chip 1. Specifically, the mounting lead 2 is separated from the semiconductor chip 1 in the direction Xa, the mounting lead 3 is separated from the semiconductor chip 1 in the direction Xb, and the mounting lead 4 is separated from the semiconductor chip 1 in the direction Xb. This allows the semiconductor chip 1 to be located between the mounting lead 2 and the mounting lead 3 and between the mounting lead 2 and the mounting lead 4.

As shown in FIG. 1, the mounting lead 2 has a mounting lead main surface 21 and a mounting lead bottom 22. The mounting lead main surface 21 and the mounting lead bottom 22 have a planar shape widened in the XY plane. The mounting lead main surface 21 faces the direction Za and the mounting lead bottom 22 faces the direction Zb. That is, the mounting lead main surface 21 and the mounting lead bottom 22 face in opposite directions. In this embodiment, the mounting lead main surface 21 is located above the electrode surface 11 in the direction Za (see FIG. 1). This allows the mounting lead 2 to be thicker than the semiconductor chip 1. The mounting lead bottom 22 is bonded to a wiring layer of the circuit board 106 via the solder layer 108. This allows the mounting lead 2 to make electrical conduction with the wiring layer of the circuit board 106.

As shown in FIGS. 3 and 5, the mounting lead 2 includes a support 26 and a plurality of (three in this embodiment) band-shaped portions 27. The support 26 is used to support the connection lead 51 which will be described later. The support 26 extends in the direction Y. The support 26 has a shape which extends along the chip side 16 and faces the chip side 16.

As shown in FIGS. 3 and 5, the support 26 includes a base 261, a first projecting extension 262 and two second projecting extensions 263 and 264. The base 261 forms part of the mounting lead main surface 21 and the mounting lead bottom 22. The base 261 corresponds to a portion of the support 26 which overlaps with the mounting lead bottom 22 when viewed in the direction Z. The first projecting extension 262 forms part of the mounting lead main surface 21. The first projecting extension 262 has a shape projecting from the base 261 toward the semiconductor chip 1 when viewed in the direction Z. Accordingly, the mounting lead main surface 21 has a portion protruding toward the semiconductor chip 1 such that the protruding portion is arranged closer to the semiconductor chip 1 than the mounting lead bottom 22, when viewed in the direction Z. That is, in this embodiment, the mounting lead main surface 21 has a portion closer to the semiconductor chip 1 than the mounting lead bottom 22 when viewed in the direction Z. As shown in FIGS. 3 and 5, although the support 26 preferably has the first projecting extension 262 extending along the direction Y, the support 26 may have a plurality of first projecting extensions arranged along the direction Y. As shown in FIG. 1, the first projecting extension 262 overlaps with the semiconductor chip 1 in the direction Z. In addition, in this embodiment, the first projecting extension 262 overlaps with the main surface electrode 11 in the direction Z.

The second projecting extensions 263 and 264 shown in FIGS. 3 and 5 form part of the mounting lead main surface 21. The second projecting extension 263 has a shape projecting from the base 261 in the direction Ya. Accordingly, the mounting lead main surface 21 has a portion protruding in the direction Ya from an end portion of the mounting lead bottom 22 when viewed in the direction Z. The second projecting extension 264 has a shape projecting from the base 261 in the direction Yb. Accordingly, the mounting lead main surface 21 has a portion protruding in the direction Yb from an end portion of the mounting lead bottom 22 when viewed in the direction Z. The second projecting extensions 263 and 264 are used to prevent the mounting lead 2 from being dropped out of the resin portion 8, which will be described later.

As shown in FIGS. 3 and 5, the three band-shaped portions 27 are arranged in the direction Y. Each band-shaped portion 27 extends along the direction X. Each band-shaped portion 27 is connected to the support 26 (the base 261 in this embodiment). The support 26 is located between each band-shaped portion 27 and the semiconductor chip 1. Each band-shaped portion 27 forms part of the mounting lead main surface 21 and the mounting lead bottom 22.

The mounting lead 3 shown in FIG. 1 has substantially the same configuration as the mounting lead 2. The mounting lead 3 has a mounting lead main surface 31 and a mounting lead bottom 32. The mounting lead main surface 31 and the mounting lead bottom 32 have a planar shape widened in the XY plane. The mounting lead main surface 31 faces the direction Za and the mounting lead bottom 32 faces the direction Zb. That is, the mounting lead main surface 31 and the mounting lead bottom 32 face in opposite directions. In this embodiment, the mounting lead main surface 31 is located in the direction Za from the electrode surface 111 (that is, above the electrode surface 111 in FIG. 1). This allows the mounting lead 3 to be thicker than the semiconductor chip 1. The mounting lead bottom 32 is bonded to a wiring layer of the circuit board 106 via the solder layer 109. This allows the mounting lead 3 to make electrical conduction with the wiring layer of the circuit board 106.

As shown in FIGS. 3 and 5, the mounting lead 3 includes a support 36 and a plurality of (two in this embodiment) band-shaped portions 37. The support 36 is used to support the connection lead 51, which will be described later. The support 36 extends in the direction Y. The support 36 has a shape which extends along the chip side 18 and faces the chip side 18.

As shown in FIGS. 3 and 5, the support 36 includes a base 361, a first projecting extension 362 and two second projecting extensions 363 and 364. The base 361 forms part of the mounting lead main surface 31 and the mounting lead bottom 32. The base 361 corresponds to a portion of the support 36 which overlaps with the mounting lead bottom 32 when viewed in the direction Z. The first projecting extension 362 forms part of the mounting lead main surface 31. The first projecting extension 362 has a shape projecting from the base 361 toward the semiconductor chip 1 when viewed in the direction Z. Accordingly, the mounting lead main surface 31 has a portion protruding toward the semiconductor chip 1 such that the protruding portion is arranged closer to the semiconductor chip 1 than the mounting lead bottom 32 when viewed in the direction Z. That is, in this embodiment, the mounting lead main surface 31 has a portion closer to the semiconductor chip 1 than the mounting lead bottom 32 when viewed in the direction Z. As shown in FIGS. 3 and 5, although the support 36 preferably has the first projecting extension 362 extending along the direction Y, the support 36 may have a plurality of first projecting extensions arranged along the direction Y. As shown in FIG. 1, the first projecting extension 362 overlaps with the semiconductor chip 1 in the direction Z. In addition, in this embodiment, the first projecting extension 362 overlaps with the main surface electrode 11 in the direction Z.

The second projecting extensions 363 and 364 shown in FIGS. 3 and 5 form the mounting lead main surface 31. The second projecting extension 363 has a shape projecting from the base 361 in the direction Ya. Accordingly, the mounting lead main surface 31 has a portion protruding in the direction Ya from an end portion of the mounting lead bottom 32 when viewed in the direction Z. The second projecting extension 364 has a shape projecting from the base 361 in the direction Yb. Accordingly, the mounting lead main surface 31 has a portion protruding in the direction Yb from an end portion of the mounting lead bottom 32 when viewed in the direction Z. The second projecting extensions 363 and 364 are used to prevent the mounting lead 3 from being dropped out of the resin portion 8, which will be described later.

As shown in FIGS. 3 and 5, the two band-shaped portions 37 are arranged in the direction Y. Each band-shaped portion 37 extends along the direction X. Each band-shaped portion 37 is connected to the support 36 (the base 361 in this embodiment). The support 36 is located between each band-shaped portion 37 and the semiconductor chip 1. Each band-shaped portion 37 forms part of the mounting lead main surface 31 and the mounting lead bottom 32.

Unlike the mounting lead 2, in the mounting lead 3, the support 36 projects toward the mounting lead 4 from one of the plurality of band shape portions 37 which is closest to the mounting lead 4.

The mounting lead 4 shown in FIGS. 3, 5 and 7 has a mounting lead main surface 41 and a mounting lead bottom 42. The mounting lead main surface 41 and the mounting lead bottom 42 have a planar shape widened in the XY plane. The mounting lead main surface 41 faces the direction Za and the mounting lead bottom 42 faces the direction Zb. That is, the mounting lead main surface 41 and the mounting lead bottom 42 face in opposite directions. In this embodiment, the mounting lead main surface 41 is located in the direction Za above the electrode surface 111. That is, the mounting lead 4 is thicker than the semiconductor chip 1. The mounting lead bottom 42 is bonded to a wiring layer of the circuit board 106 via a solder layer (not shown). This allows the mounting lead 4 to make electrical conduction with the wiring layer of the circuit board 106.

As shown in FIGS. 3 and 5, the mounting lead 4 includes a support 46 and a band-shaped portion 47. The support 46 is used to support the connection lead 52, which will be described later. The support 46 has a shape which extends along the chip side 18 and faces the chip side 18.

As shown in FIGS. 3 and 5, the support 46 includes a base 461, a first projecting extension 462 and a second projecting extension 463. The base 461 forms part of the mounting lead main surface 41 and the mounting lead bottom 42. The base 461 corresponds to a portion of the support 46 which overlaps with the mounting lead bottom 42 when viewed in the direction Z. The first projecting extension 462 forms part of the mounting lead main surface 41. The first projecting extension 462 has a shape projecting from the base 461 toward the semiconductor chip 1 when viewed in the direction Z. Accordingly, the mounting lead main surface 41 has a portion located at the side of the semiconductor chip 1 than the mounting lead bottom 42 when viewed in the direction Z. That is, in this embodiment, the mounting lead main surface 41 has a portion closer to the semiconductor chip 1 than the mounting lead bottom 42 when viewed in the direction Z. As shown in FIG. 7, the first projecting extension 462 overlaps with the semiconductor chip 1 in the direction Z. In addition, in this embodiment, the first projecting extension 462 overlaps with the main surface electrode 11 in the direction Z.

The second projecting extension 463 forms part of the mounting lead main surface 41. The second projecting extension 463 has a shape projecting from the base 461 in the direction Yb. Accordingly, the mounting lead main surface 41 has a portion protruding in the direction Yb from and end portion of the mounting lead bottom 42 when viewed in the direction Z. The second projecting extension 463 is used to prevent the mounting lead 4 from being dropped out of the resin portion 8, which will be described later.

The band-shaped portion 47 extends in the direction X. The band-shaped portion 47 is connected to the support 46 (the base 461 in this embodiment). The support 46 is located between the band-shaped portion 47 and the semiconductor chip 1. The band-shaped portion 47 forms part of the mounting lead main surface 41 and the mounting lead bottom 42.

The connection lead 51 shown in FIGS. 1, 2, 6 and 7 is used to make electrical conduction between the main surface electrode 11, the mounting lead 2 and the mounting lead 3. The connection lead 51 is made of a conductor such as, for example, copper. As shown in FIG. 2, the connection lead 51 overlaps with the main surface electrode 11, the mounting lead 2 and the mounting lead 3 when viewed in the direction Z. The connection lead 51 also overlaps with the first projecting extensions 262 and 362 when viewed in the direction Z. The dimension of the connection lead 51 in the direction X is larger than the dimension of the semiconductor chip 1 in the direction X. In addition, the connection lead 51 spans over the mounting lead 2 and the mounting lead 3 when viewed in the direction Z. The dimension of the connection lead 51 in the direction Y may be larger or smaller than the dimension of the semiconductor chip 1 in the direction Y and the dimension of the mounting lead 3 in the direction Y. In this embodiment, the dimension of the connection lead 51 in the direction Y is smaller than both of the dimension of the semiconductor chip 1 in the direction Y and the dimension of the mounting lead 3 in the direction Y. It is shown in FIG. 2 that the connection lead 51 has a rectangular shape missing one corner when viewed in the direction Z but the connection lead 51 is not limited to such shape. In this embodiment, the connection lead 51 has a plate shape along the XY plane.

The thickness (dimension in the direction Z) of the connection lead 51 is, for example, 100 to 500 μm. The dimension of the connection lead 51 in the direction X is, for example, 1000 to 100000 μm. The dimension of the connection lead 51 in the direction Y is, for example, 1000 to 100000 μm.

As shown in FIGS. 1, 2 and 6, the connection lead 51 includes a connection lead main surface 511, a connection lead rear surface 512 and connection lead sides 513 and 514. The connection lead main surface 511 has a planar shape along the XY plane and faces the direction Za. The connection lead rear surface 512 has a planar shape along the XY plane and faces the direction Zb. That is, the connection lead main surface 511 and the connection lead rear surface 512 face in opposite directions. The connection lead rear surface 512 faces the electrode surface 11 and the mounting lead main surfaces 21 and 31. The connection lead side 513 faces the direction Xa and the connection lead side 514 faces the direction Xb. When viewed in the direction Z, the connection lead side 513 overlaps with the mounting lead 2 and the connection lead side 514 overlaps with the mounting lead 3.

As shown in FIGS. 2 and 6, two concave portions 518 and one concave portion 519 are formed in the connection lead 51. Each concave portion 518 is dented from the connection lead side 513 toward the semiconductor chip 1. Similarly, the concave portion 519 is dented from the connection lead side 514 toward the semiconductor chip 1. As an alternative embodiment, the concave portions 518 and 519 may not be formed in the connection lead 51.

The connection lead 52 shown in FIGS. 2 and 7 is used to make electrical conduction between the main surface electrode 12 and the mounting lead 4. The connection lead 52 has a connection lead main surface 521 and a connection lead rear surface 522. The connection lead 52 has substantially the same function as the connection lead 51, i.e., to make electrical conduction between a main surface electrode and a mounting lead and, therefore, explanation of which will not be repeated.

Each of the conductive bondings 61 to 65 shown in FIGS. 1, 2, 6 and 7 is made of a conductor. An example of the conductor of which each conductive bonding 61 to 65 is made may include solder, silver and so on. In this embodiment, the conductor of which each conductive bonding 61 to 65 is made is solder.

As shown in FIGS. 1 and 2, the conductive bonding 61 is interposed between the connection lead 51 (the connection lead rear surface 512) and the main surface electrode 11 (the electrode surface 111). The conductive bonding 61 bonds the connection lead 51 (connection lead rear surface 512) to the main surface electrode 11 (the electrode surface 111). The conductive bonding 61 makes direct contact with the connection lead 51 and the main surface electrode 11. This makes electrical conduction between the connection lead 51 and the main surface electrode 11 via the conductive bonding 61 possible.

The conductive bonding 62 is interposed between the connection lead 51 (the connection lead rear surface 512) and the mounting lead 2 (the mounting lead main surface 21). The conductive bonding 62 bonds the connection lead 51 (connection lead rear surface 512) to the mounting lead 2 (the mounting lead main surface 21). The conductive bonding 62 makes direct contact with the connection lead 51 and the mounting lead 2. This makes electrical conduction between the connection lead 51 and the mounting lead 2 via the conductive bonding 62 possible. As shown in FIGS. 2 and 6, the conductive bonding 62 may get into the concave portion 518.

As shown in FIGS. 1 and 2, like the conductive bonding 62, the conductive bonding 63 is interposed between the connection lead 51 (the connection lead rear surface 512) and the mounting lead 3 (the mounting lead main surface 31). The conductive bonding 63 bonds the connection lead 51 (connection lead rear surface 512) to the mounting lead 3 (the mounting lead main surface 31). The conductive bonding 63 makes direct contact with the connection lead 51 and the mounting lead 3. This makes electrical conduction between the connection lead 51 and the mounting lead 3 via the conductive bonding 63 possible. As shown in FIGS. 2 and 6, the conductive bonding 63 may get into the concave portion 519.

As can be seen from above, in this embodiment, electrical conduction is made between the main surface electrode 11 as the source electrode, the mounting leads 2 and 3, the connection lead 51, the conductive bondings 61 to 63 and the solder layers 108 and 109. In addition, the solder layer 108 may make electrical conduction with the solder layer 109 via a wiring layer in the circuit board 106.

As described above, the mounting lead main surface 21 is located in the direction Za above the electrode surface 111. Accordingly, the distance between the electrode surface 111 and the connection lead 51 (i.e., the dimension of the conductive bonding 61 in the direction Z) is larger than the distance between the mounting lead main surface 21 and the connection lead 51 (i.e., the dimension of the conductive bonding 62 in the direction Z). Similarly, the distance between the electrode surface 111 and the connection lead 51 (i.e., the dimension of the conductive bonding 61 in the direction Z) is larger than the distance between the mounting lead main surface 31 and the connection lead 51 (i.e., the dimension of the conductive bonding 63 in the direction Z).

As shown in FIGS. 2 and 7, the conductive bonding 64 is interposed between the connection lead 52 and the main surface electrode 12 (the electrode surface 121). The conductive bonding 64 bonds the connection lead 52 to the main surface electrode 12. The conductive bonding 65 is interposed between the connection lead 52 and the mounting lead 4 (the mounting lead main surface 41). The conductive bonding 65 bonds the connection lead 52 to the mounting lead 4. In this embodiment, electrical conduction is made between the main surface electrode 12 as the gate electrode, the mounting lead 4, the connection lead 52 and the conductive bondings 64 and 65.

The resin portion 8 shown in FIGS. 1 to 7 covers the semiconductor chip 1, the mounting leads 2 to 4, the connection leads 51 and 52 and the conductive bondings 61 to 65. The resin portion 8 is made of, for example, black epoxy resin. As shown in FIG. 1, the resin portion 8 has a resin bottom 81, a resin side 82 and a resin main surface 83. The resin bottom 81 has a planar shape widened in the XY plane and faces the direction Zb. The mounting lead bottoms 22, 32 and 42 and the rear surface electrode 13 are exposed from the resin bottom 81. The resin bottom 81, the mounting lead bottoms 22, 32 and 42, the rear surface electrode 13 and the electrode surface 131 lie on the same plane.

As shown in FIGS. 1, 2 and 4, the resin side 82 has a shape surrounding the semiconductor chip 1 when viewed in the direction Z. In this embodiment, the resin side 82 surrounds both of the connection leads 51 and 52. The resin side 82 has an erect portion 821 and an inclined portion 822. The erect portion 821 is connected to the resin bottom 81. The erect portion 821 is perpendicular to the resin bottom 81. The band-shaped portion 27 in the mounting lead 2, the band-shaped portion 37 in the mounting lead 3 and the band-shaped portion 47 in the mounting lead 4 are exposed from the erect portion 821. In this embodiment, the band-shaped portions 27, 37 and 47 project from the erect portion 821. As an alternative embodiment, for example, the band-shaped portion 27 may have a side 271 on the same side as the resin side 82 (see FIG. 8, which is equally applied to the band-shaped portions 37 (371) and 47) without projection of the band-shaped portions 27, 37 and 47 from the erect portion 821. As shown in FIG. 1, the inclined portion 822 is inclined in the direction Z to make an acute angle with the resin bottom 81. The inclined portion 822 is connected to the erect portion 821.

Figure 8:
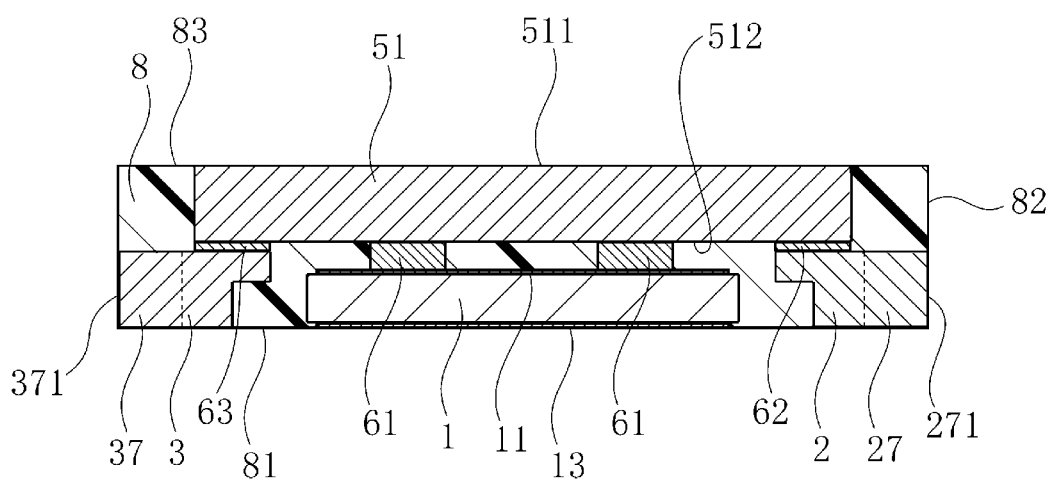
FIG. 8 is a sectional view showing a modification of the semiconductor device according to the first embodiment.

The resin main surface 83 has a planar shape widened in the XY plane. The resin main surface 83 is connected to the inclined portion 822. The connection lead 51 is located between the resin main surface 83 and the semiconductor chip 1. That is, the connection lead main surface is covered with the resin portion 8. As an alternative embodiment, the connection lead 51 may be exposed from the resin main surface 83, as shown in FIG. 8. It is shown in FIG. 8 that the resin main surface 83 and the connection lead main surface 511 lie on the same plane.

Next, an exemplary method for manufacturing the semiconductor device 100 will be described in brief with reference to FIGS. 9 to 19.

Figure 9:
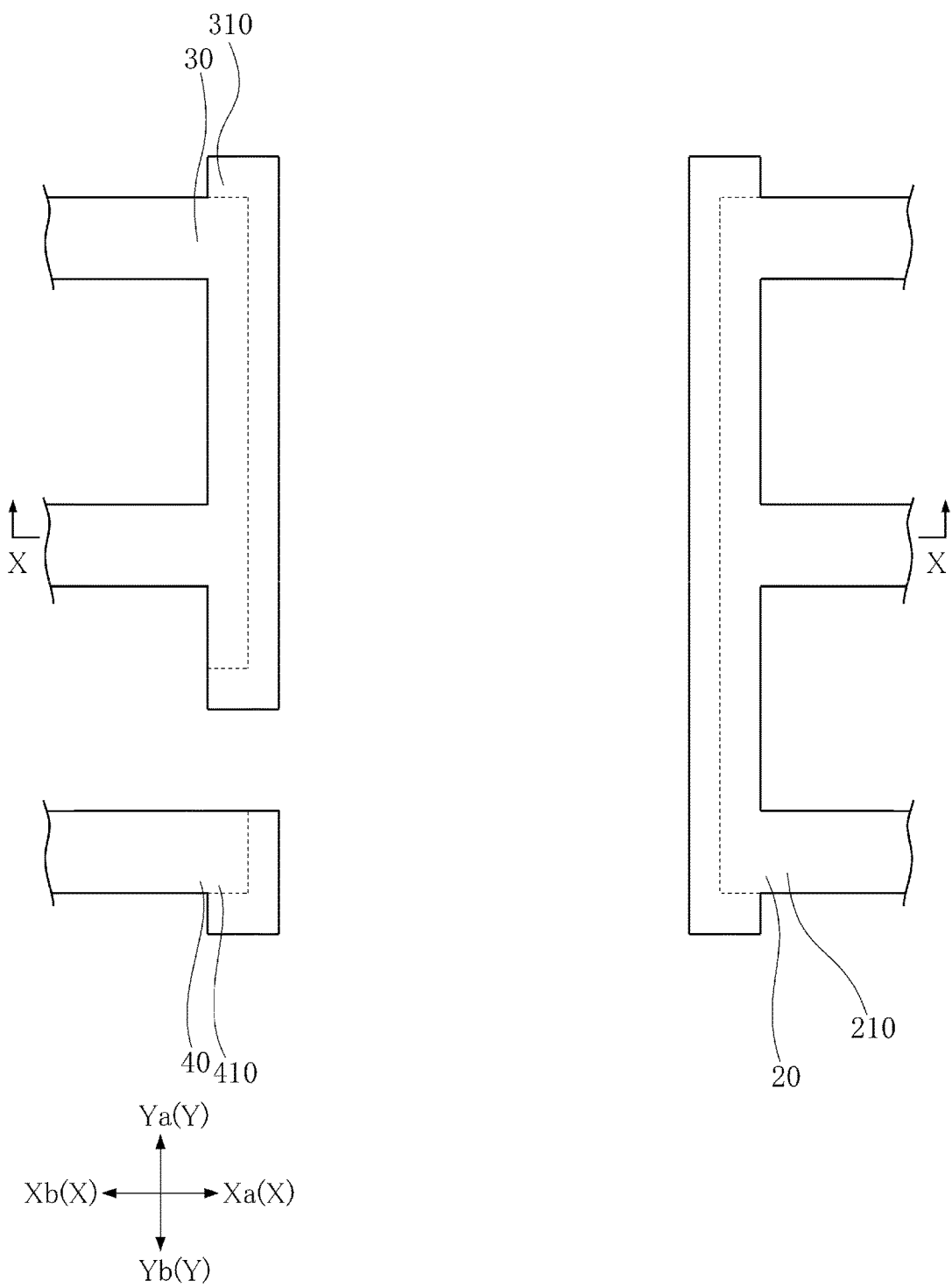
FIG. 9 is a main part plan view showing one process in a manufacturing method of the semiconductor device according to the first embodiment.
Figure 10:
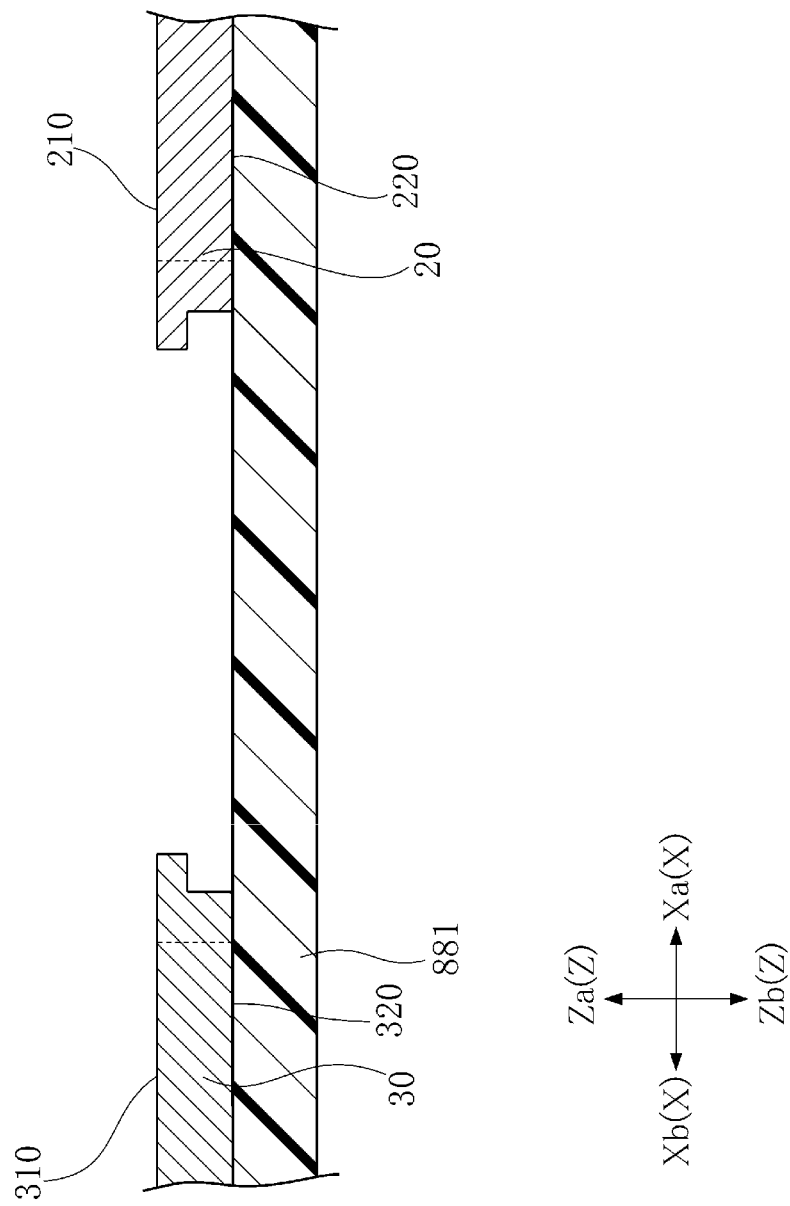
FIG. 10 is a main part sectional view taken along line X-X in FIG. 9.

As shown in FIGS. 9 and 10, mounting leads 20, 30 and 40 are first bonded to a tape 881. The tape 881 is a heat resistant tape made of, for example, polyimide. TRM6250 available from Nitto Denko Cooperation may be used for the heat resistant tape. For bonding of the mounting leads 20, 30 and 40 to the tape 881, a mounting lead bottom 220 of the mounting lead 20, a mounting lead bottom 320 of the mounting lead 30 and a mounting lead bottom of the mounting lead 40 are bonded to the tape 881. This prevents resin burrs from being formed in the mounting lead bottoms 220 and 320 and so on in a process of forming the resin portion 8, which will be described later.

Figure 11:
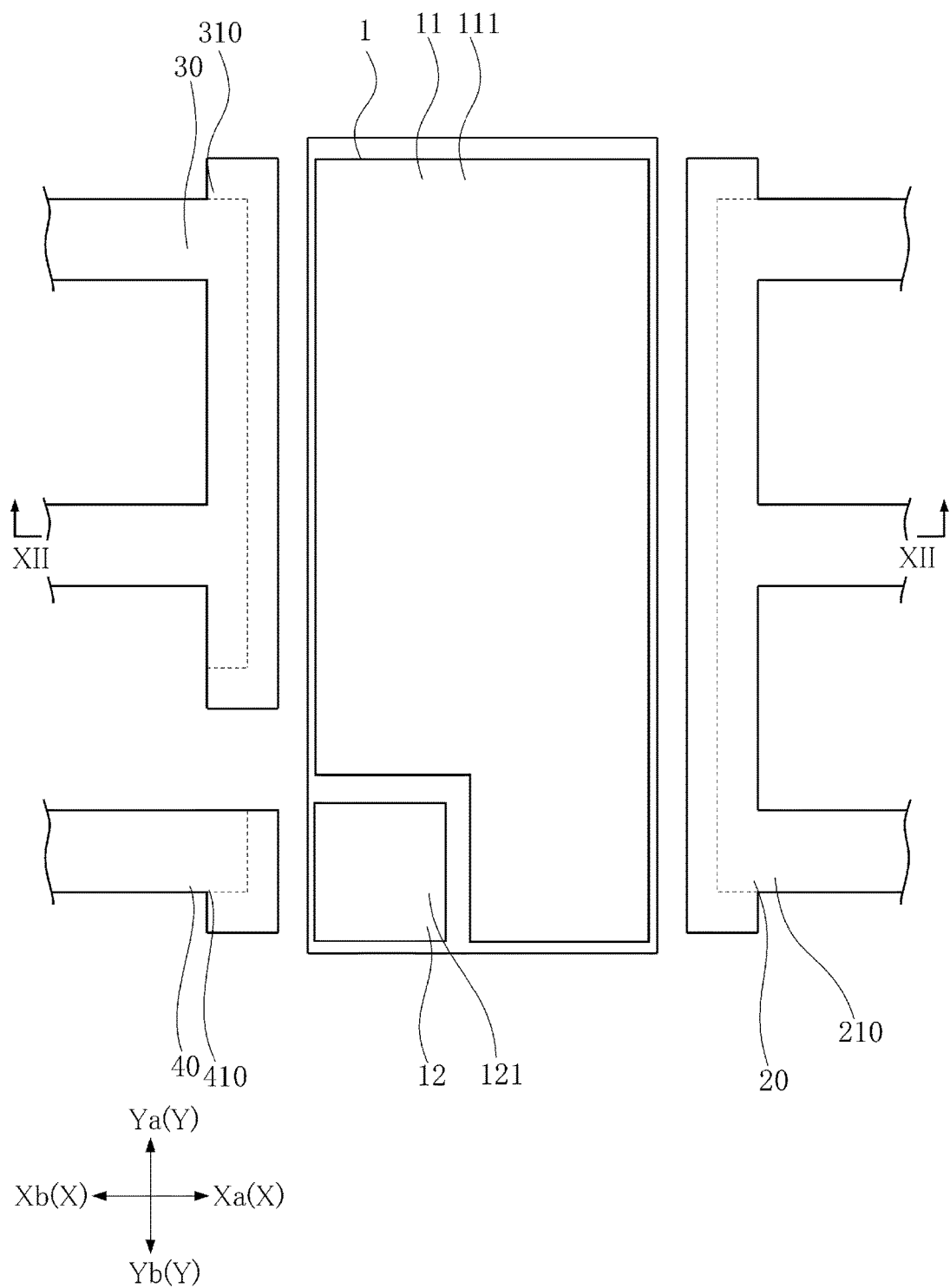
FIG. 11 is a main part plan view showing a process subsequent to FIG. 9.
Figure 12:
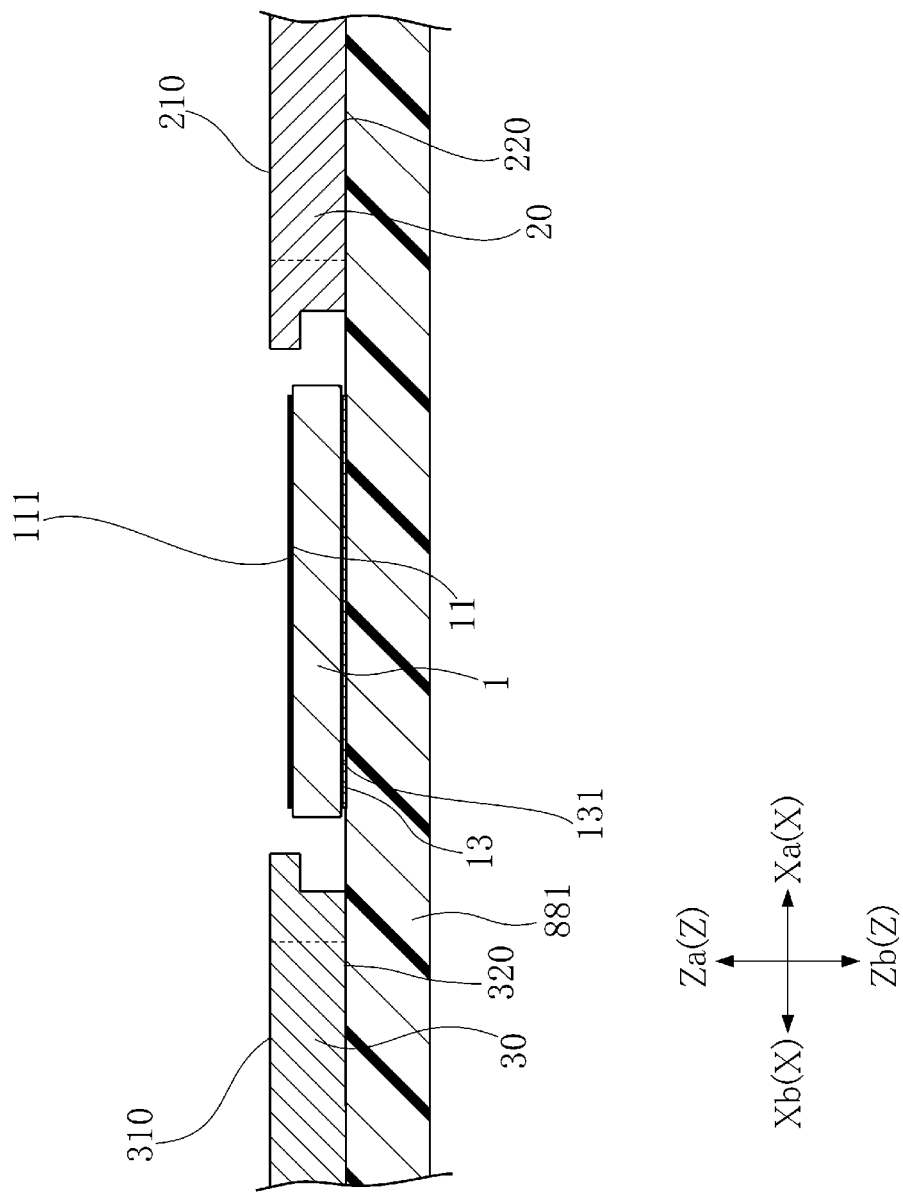
FIG. 12 is a main part sectional view taken along line XII-XII in FIG. 11.

Next, as shown in FIGS. 11 and 12, the semiconductor chip 1 is bonded to the tape 881. The semiconductor chip 1 is placed at a position at which it overlaps with all of the mounting leads 20, 30 and 40 in the thickness direction Z of the semiconductor chip 1. For bonding of the semiconductor chip 1 to the tape 881, the electrode surface 131 of the rear surface electrode 13 is bonded to the tape 881. This prevents resin burrs from being formed in the electrode surface 131 in the process of forming the resin portion 8, which will be described later.

Figure 13:
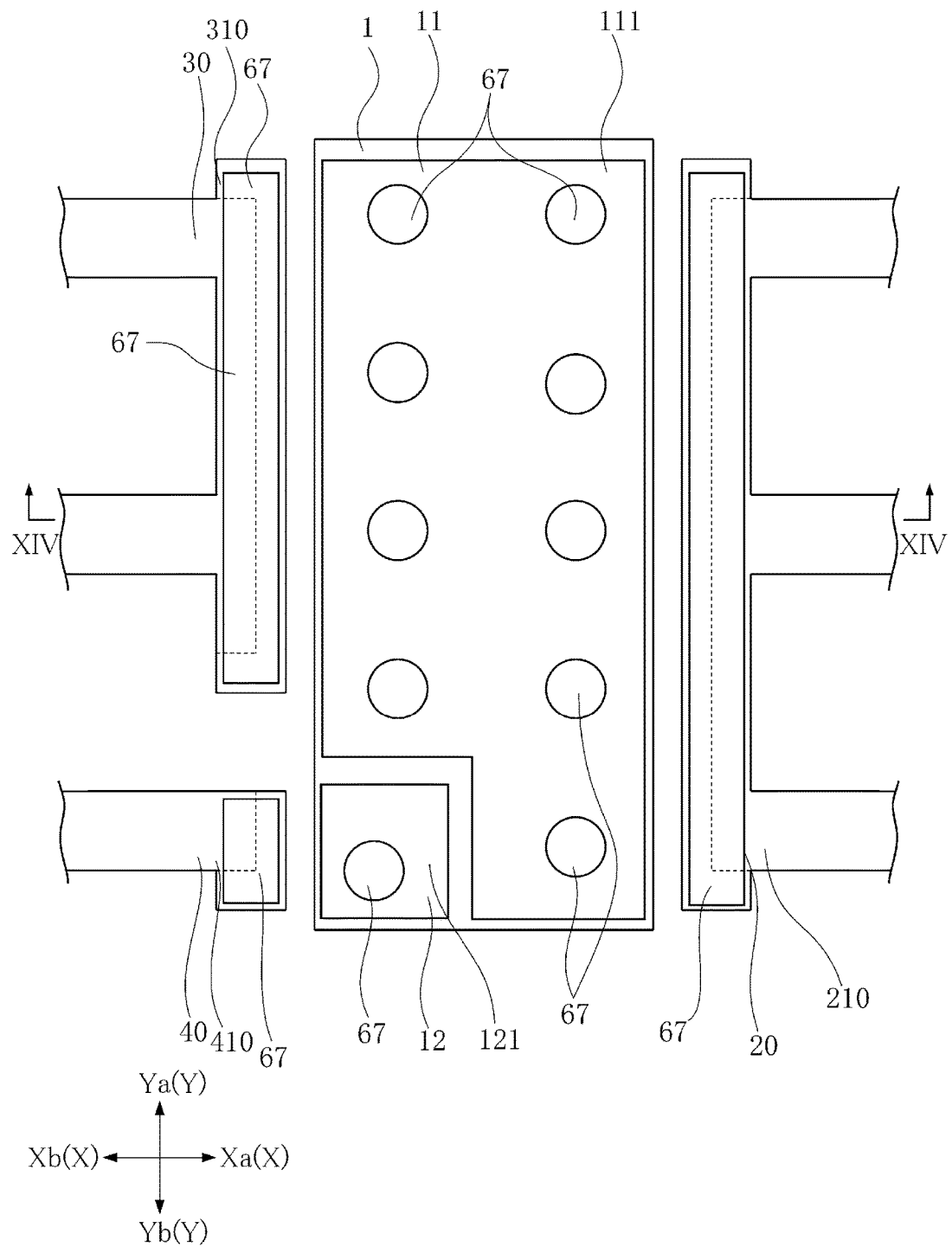
FIG. 13 is a main part plan view showing a process subsequent to FIG. 11.
Figure 14:
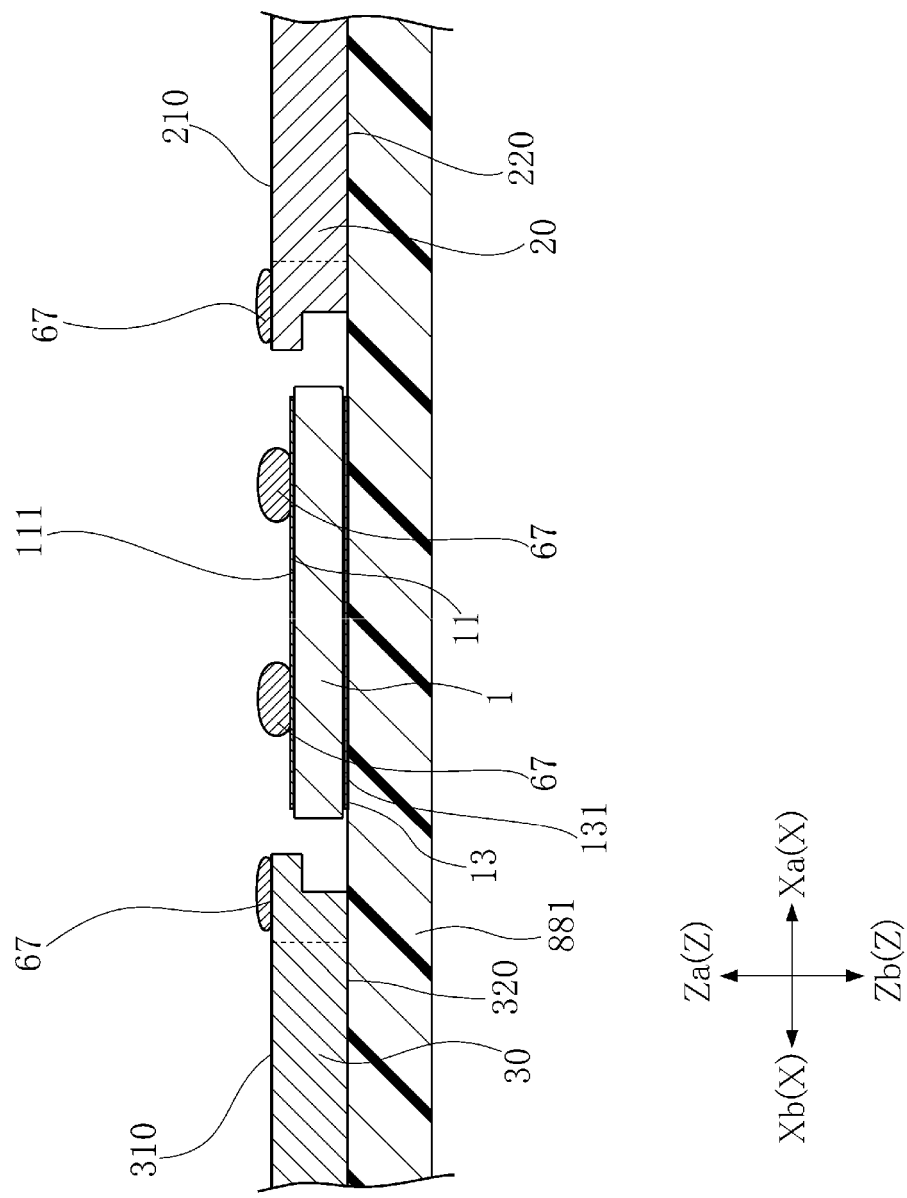
FIG. 14 is a main part sectional view taken along line XIV-XIV in FIG. 13.

Next, as shown in FIGS. 13 and 14, a plurality of conductive bonding materials 67 are coated on the main surface electrodes 11 and 12 of the semiconductor chip 1, a mounting lead main surface 210 of the mounting lead 20, a mounting lead main surface 310 of the mounting lead 30 and a mounting lead main surface 410 of the mounting lead 40. In this embodiment, an example of the conductive bonding materials 67 may include solder.

Figure 15:
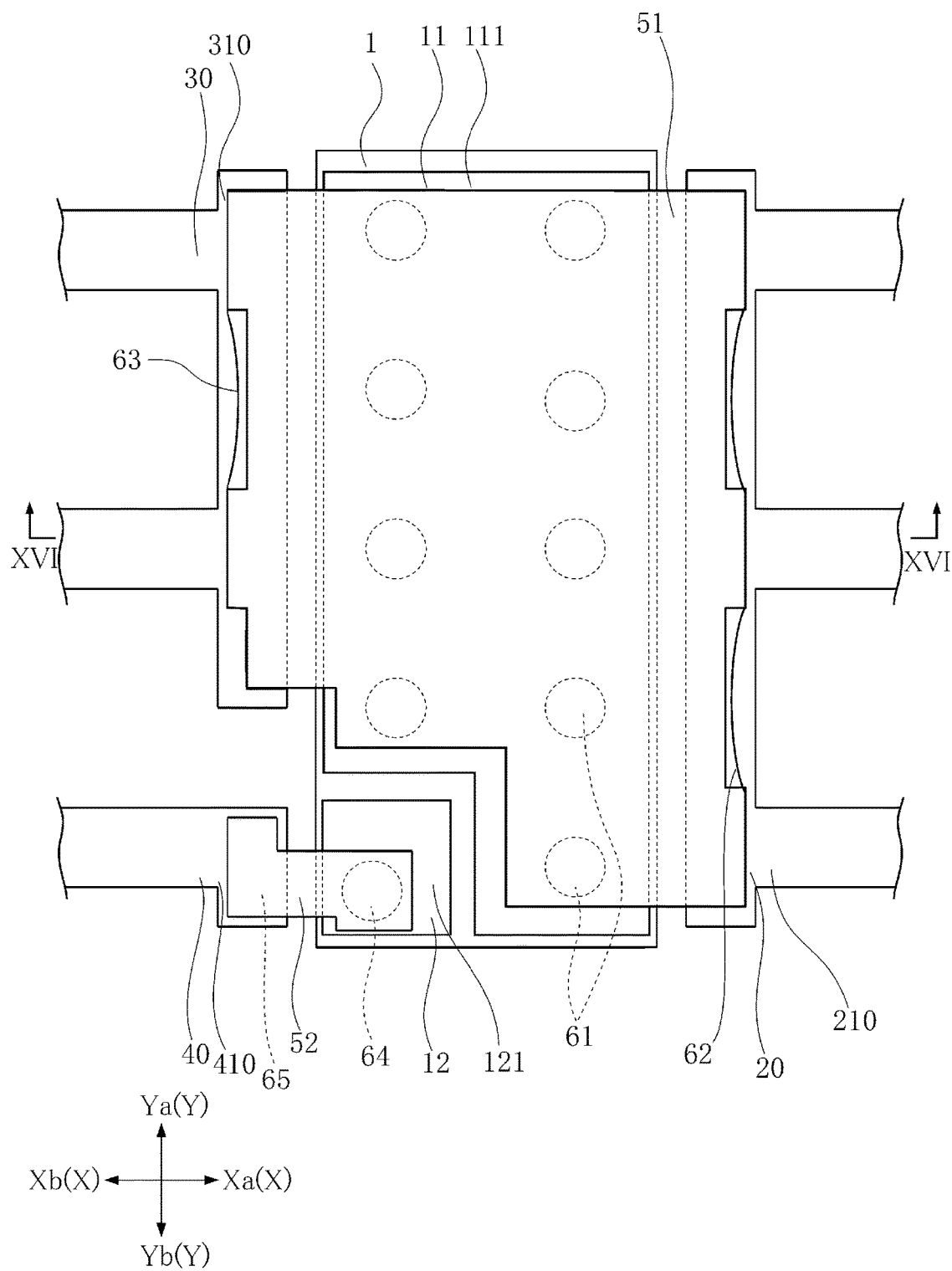
FIG. 15 is a main part plan view showing a process subsequent to FIG. 13.
Figure 16:
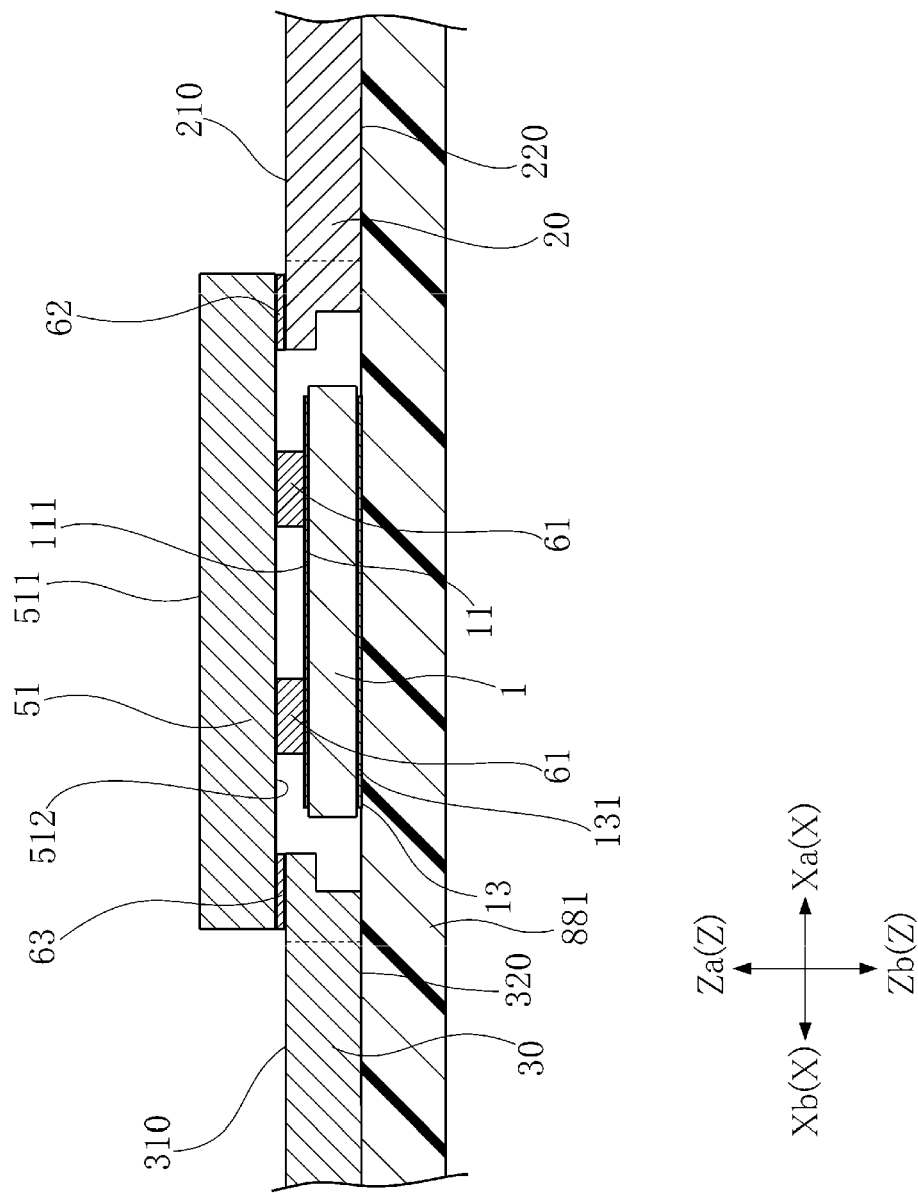
FIG. 16 is a main part sectional view taken along line XVI-XVI in FIG. 15.

Next, as shown in FIGS. 15 and 16, the connection leads 51 and 52 are placed on the conductive bonding materials 67. Specifically, the connection lead 51 is placed at a position at which it overlaps with the main surface electrode 11 and the mounting leads 20 and 30 when viewed in the direction Z. Then, the connection lead 52 is placed at a position at which it overlaps with the main surface electrode 12 and the mounting lead 40 when viewed in the direction Z. Then, the product on which the connection leads 51 and 52 are placed is heated in a reflow furnace. Thus, the connection lead 51 is bonded to the main surface electrode 11 and the mounting leads 20 and 30 and the connection lead 52 is bonded to the main surface electrode 12 and the mounting lead 40. Through the bonding process of the connection leads 51 and 52, the conductive bondings 61 to 65 are formed from the conductive bonding materials 67.

Figure 17:
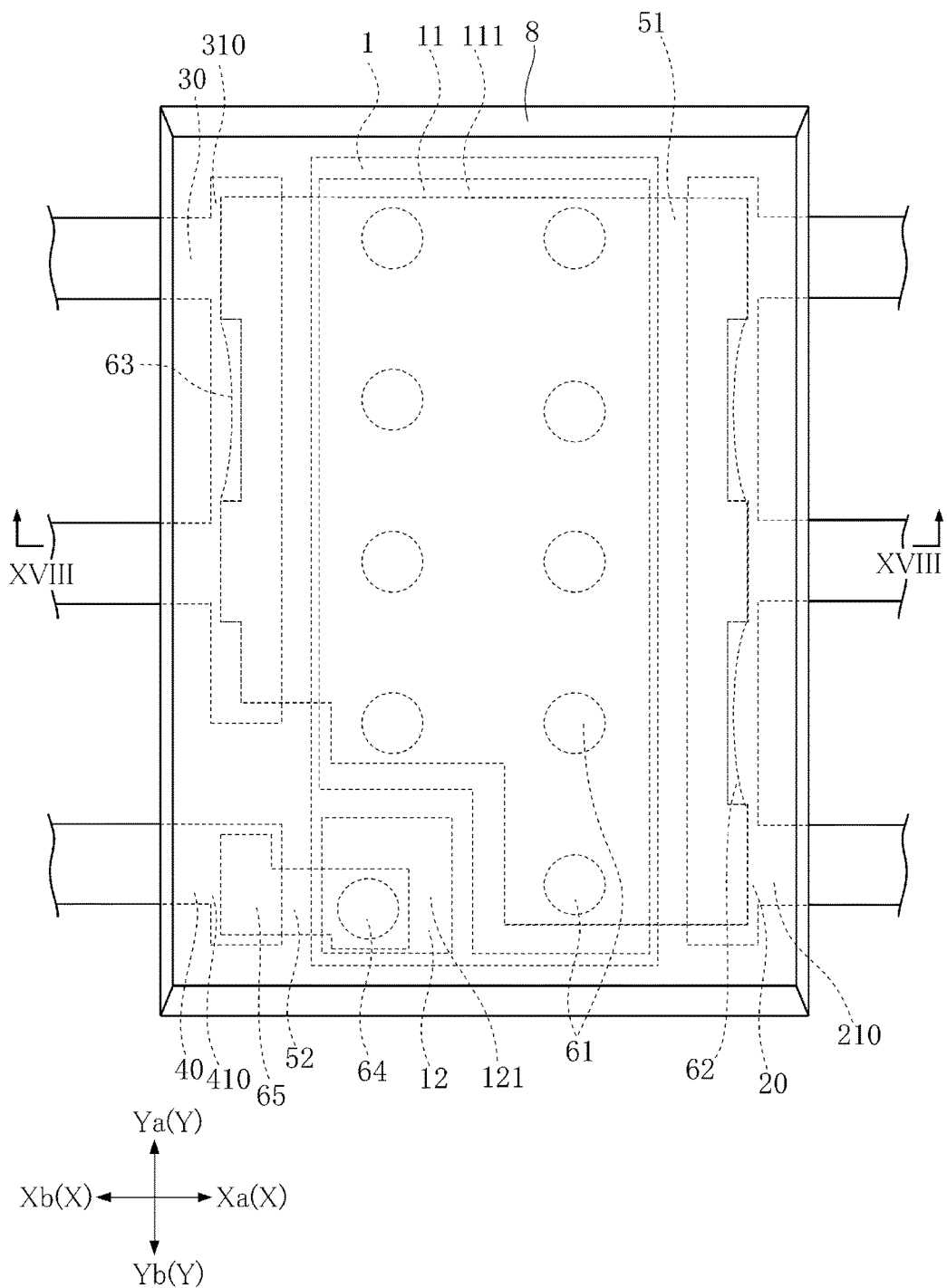
FIG. 17 is a main part plan view showing a process subsequent to FIG. 15.
Figure 18:
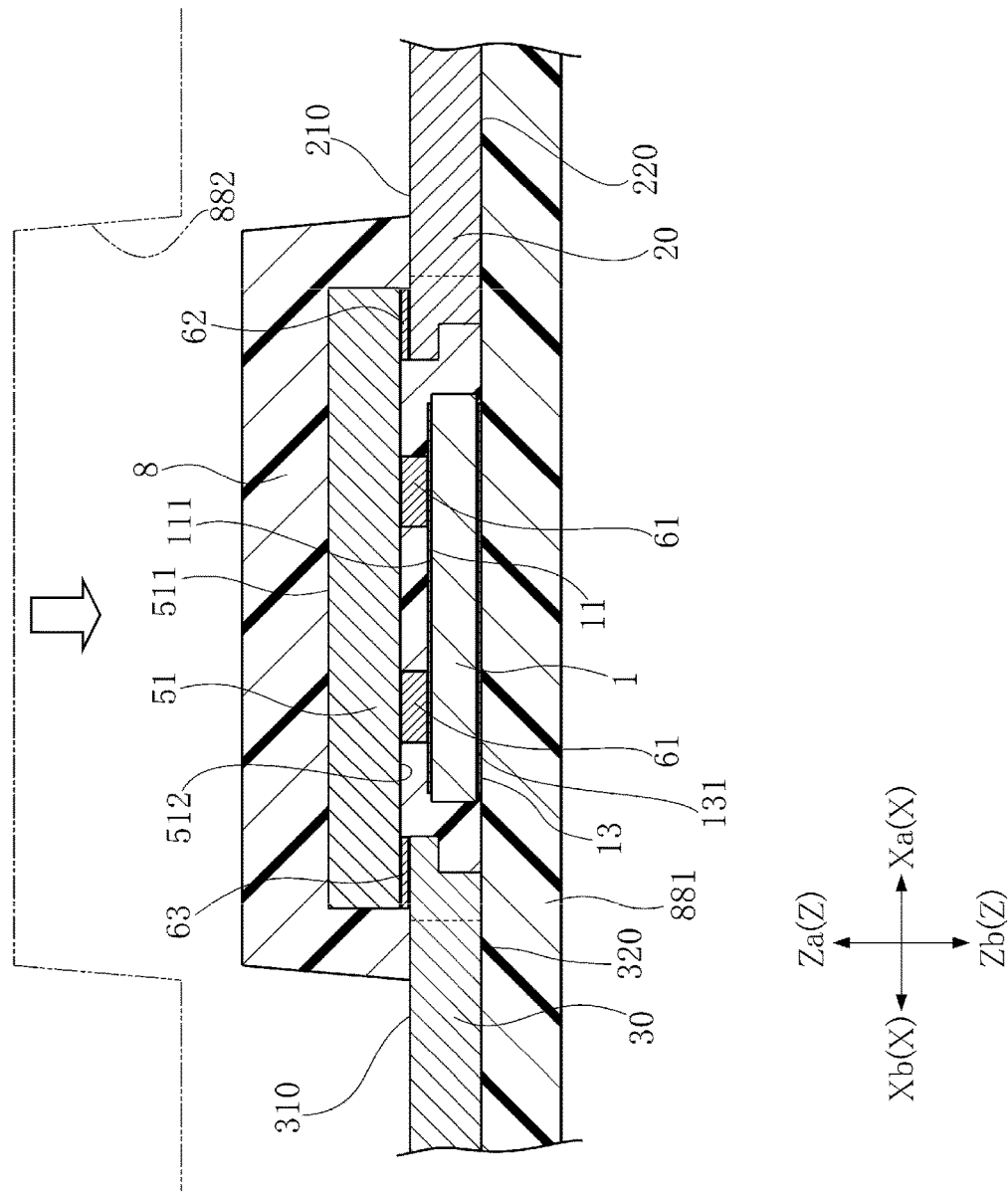
FIG. 18 is a main part sectional view taken along line XVIII-XVIII in FIG. 17.

Next, as shown in FIGS. 17 and 18, the resin portion 8 is formed. The resin portion 8 is formed under the condition where the semiconductor chip 1, the mounting leads 20, 30 and 40, the connection leads 51 and 52 and the conductive bondings 61 and 65 are accommodated by a mold 882 and the tape 881.

Figure 19:
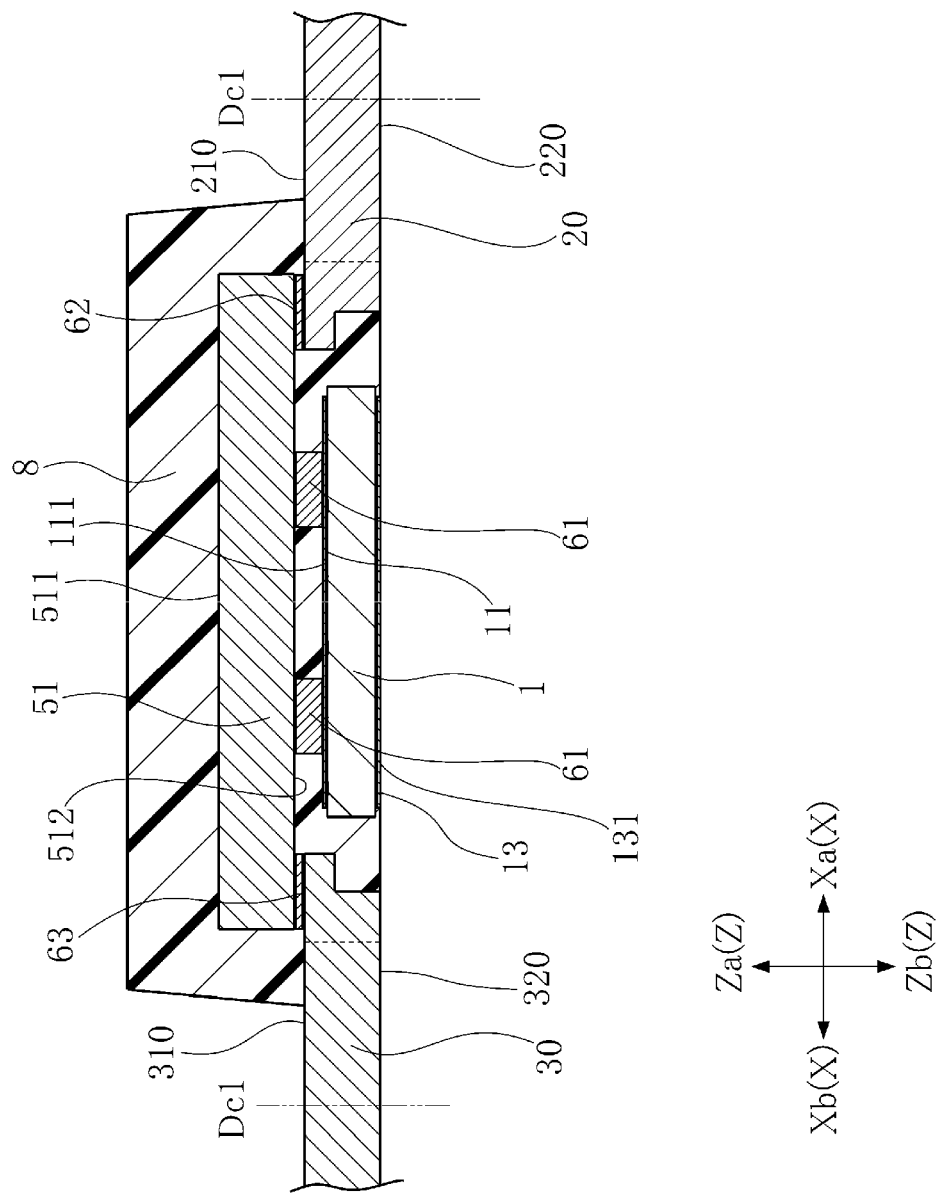
FIG. 19 is a main part sectional view showing a process subsequent to FIG. 18.

Next, as shown in FIG. 19, the tape 881 is peeled off of the semiconductor chip 1, the mounting leads 20 and 30 and the resin portion 8. Then, the mounting leads 20, 30 and 40 (the mounting lead 40 not shown) are cut out along a line Dc1, thereby completing the semiconductor device 100 shown in FIG. 1.

Next, the operation and effects of this embodiment will be described.

The semiconductor device 100 includes the plurality of mounting leads 2 and 3. The mounting lead 2 is separated from the semiconductor chip 1 in the direction Xa and the mounting lead 3 is separated from the semiconductor chip 1 in the direction Xb. With this configuration, after bonding the mounting leads 2 and 3 to the tape 881, the semiconductor chip 1 can be placed at a position at which it overlaps with both of the mounting leads 2 and 3 in the thickness direction Z of the semiconductor chip 1, as described above with reference to FIGS. 11 and 12. Thus, an apparatus for placing the semiconductor chip 1 can place the semiconductor chip 1 such that the semiconductor chip 1 contacts neither of the mounting leads 2 and 3 while confirming the positions of the mounting leads 2 and 3. Accordingly, the semiconductor chip 1 is unlikely to contact the mounting leads 2 and 3 in manufacturing the semiconductor chip 1. This eliminates the need to excessively increase the distance between the semiconductor chip 1 and the mounting lead 2 when viewed in the direction Z and the distance between the semiconductor chip 1 and the mounting lead 3 when viewed in the direction Z. In other words, it is possible to make smaller the distance between the semiconductor chip 1 and the mounting lead 2 when viewed in the direction Z and the distance between the semiconductor chip 1 and the mounting lead 3 when viewed in the direction Z. This results in a more compact semiconductor device.

As shown in FIG. 2, the semiconductor device 100 includes the connection lead 51 making electrical conduction between the main surface electrode 11 and the mounting leads 2 and 3. The connection lead 51 overlaps with the main surface electrode 11 and the mounting leads 2 and 3 when viewed in the direction Z. With this configuration, after placing the semiconductor chip 1 at a position at which it overlaps with both of the mounting leads 2 and 3 in the direction Z, electrical conduction between the main surface electrode 11 and the mounting leads 2 and 3 can be made through the connection lead 51. This eliminates the need to connect the main surface electrode 11 to the mounting leads 2 and 3 by means of wires, and thus the semiconductor device 100 can be manufactured more efficiently.

As shown in FIG. 1, in the semiconductor device 100, the semiconductor chip 1 includes the rear surface electrode 13 exposed from the resin bottom 81. With this configuration, heat generated in the semiconductor chip 1 can be emitted from the rear surface electrode 13 to the outside of the semiconductor device 100 without passing through the resin portion 8. Accordingly, the heat generated in the semiconductor chip 1 can be easily emitted out of the semiconductor device 100. This semiconductor device 100 can prevent the semiconductor chip 1 from being excessively heated. That is, the semiconductor device 100 has excellent heat dissipation.

In the semiconductor device 100, the mounting lead 2 has the mounting lead main surface 21 facing the connection lead 51. The mounting lead main surface 21 has a portion (the first projecting extension 262) located at the side of the semiconductor chip 1 closer than the mounting lead bottom 22 when viewed in the direction Z. This configuration makes it possible to further separate the rear surface electrode 13 from the mounting lead bottom 22 while increasing the area of the mounting lead main surface 21 bonded with the conductive bonding 62. Increasing the area of the mounting lead main surface 21 is most favorable to bond the connection lead 51 to the mounting lead 2 more strongly by means of the conductive bonding 62. Further, more separation of the mounting lead bottom 22 from the rear surface electrode 13 results in more separation of the solder layer 107 bonded to the rear surface electrode 13 from the solder layer 108 bonded to the mount lead bottom 22 when the semiconductor device 100 is mounted on the circuit board 106. This can prevent the solder layer 107 from making electrical conduction with the solder layer 108 due to contact therebetween. As can be seen from the above description, with the semiconductor device 100, the connection lead 51 and the mounting lead 2 can be more strongly bonded to each other and electrical conduction between the solder layer 107 and the solder layer 108 can be prevented.

In the semiconductor device 100, the mounting lead 3 has the mounting lead main surface 31 facing the connection lead 51. The mounting lead main surface 31 has a portion (the first projecting extension 362) located at the side of the semiconductor chip 1 closer than the mounting lead bottom 32 when viewed in the direction Z. For the same reasons as described above, this configuration makes it possible to more strongly bond the connection lead 51 to the mounting lead 3 and prevent electrical conduction between the solder layer 107 and the solder layer 109.

In the semiconductor device 100, the resin side 82 (the inclined portion 822 in this embodiment) surrounds the connection lead 51. That is, the side of the connection lead 51 is covered with the resin portion 8. This configuration is adapted for improvement of moisture resistance of the semiconductor device 100. The connection lead main surface 511 is also covered with the resin portion 8. This configuration is also adapted for improvement of moisture resistance of the semiconductor device 100.

Meanwhile, as shown in FIG. 8, when the connection lead main surface 511 is exposed from the resin main surface 83, the heat generated in the semiconductor chip 1 is easily emitted from the connection lead main surface 511 to the outside of the semiconductor device 100. Accordingly, the configuration where the connection lead main surface 511 is exposed from the resin main surface 83 is adapted for improvement of heat radiation of the semiconductor device 100.

In the semiconductor device 100, the concave portions 518 and 519 are formed in the connection lead 51. With this configuration, when the connection lead 51 is bonded to the semiconductor chip 1 and the mounting leads 2 and 3, a self-alignment effect of the connection lead 51 by the conductive bonding materials 67 shown in FIGS. 13 and 14 can be expected by inserting the conductive bonding materials 67 in the concave portions 518 and 519. In addition, such insertion of the conductive bonding materials 67 in the concave portions 518 and 519 can prevent the connection lead 51 from being inclined with respect to the XY plane.

FIGS. 20 to 29 show modifications of this embodiment. In these figures, the same or similar elements as the above-described embodiment are denoted by the same reference numerals.

<First Modification of Semiconductor Device according to First Embodiment>

A first modification of the semiconductor device of this embodiment will be now described with reference to FIGS. 20 and 21.

Figure 20:
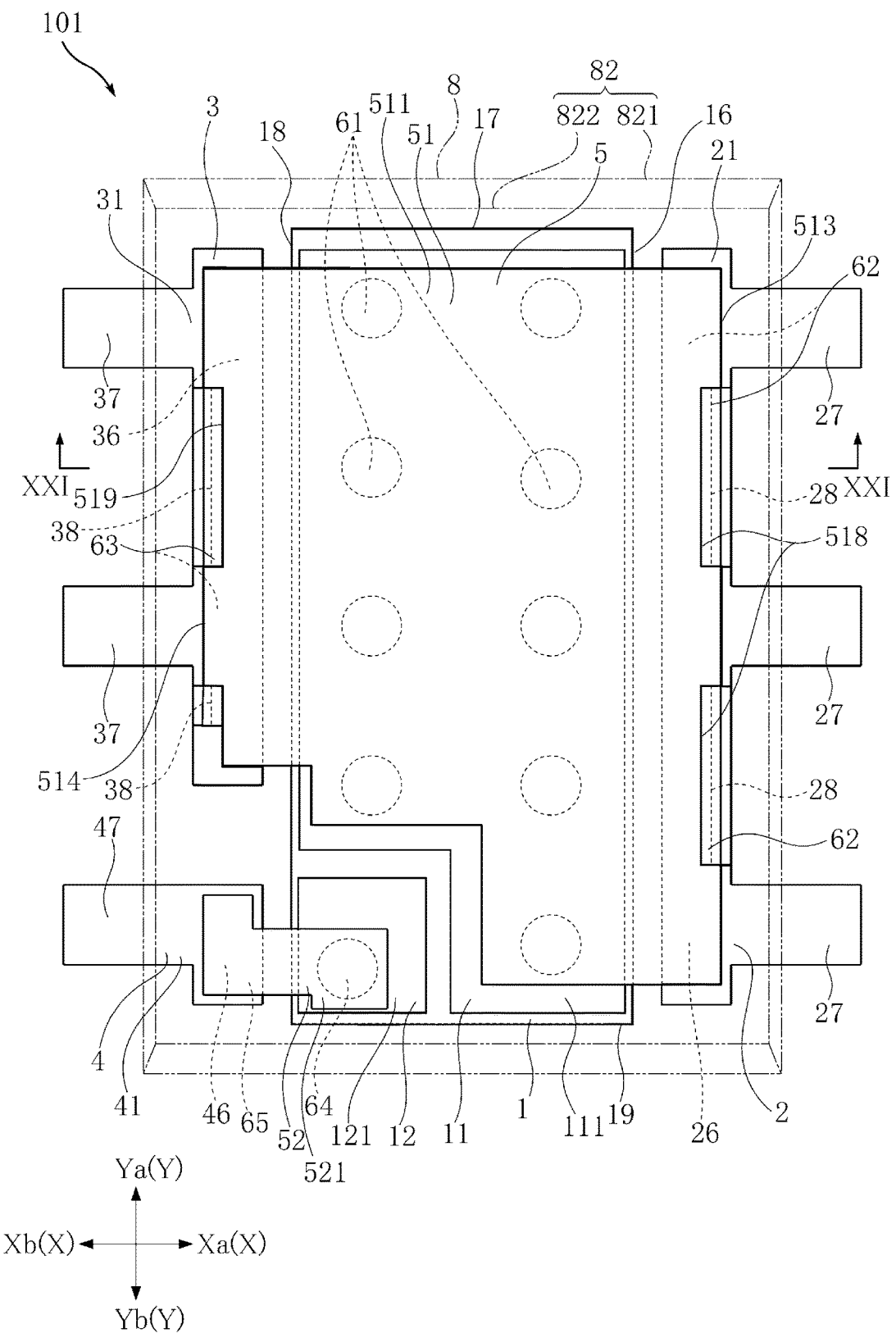
FIG. 20 is a plan view (partially omitted) of the semiconductor device according to a first modification of the first embodiment.

FIG. 20 is a plan view (partially omitted) of a semiconductor device according to the first modification. FIG. 21 is a sectional view taken along line XXI-XXI in FIG. 20.

As shown in these figures, a semiconductor device 101 includes a semiconductor chip 1, mounting leads 2 to 4, connection leads 51 and 52, conductive bondings 61 to 65 and a resin portion 8. In the semiconductor device 101, the semiconductor chip 1, the mounting lead 4, the connection leads 51 and 52, the conductive bondings 61, 64 and 65 and the resin portion 8 have the same configuration as those of the above-described semiconductor device 100 except for the mounting leads 2 and 3 and the conductive bondings 62 and 63, and therefore, explanations of the same configurations will not be repeated.

The mounting lead 2 is different from that of the semiconductor device 100 in that two concave portions 28 are formed in a support 26. Each concave portion 28 has a shape dented from a mounting lead main surface 21 into a mounting lead bottom 22. Each concave portion 28 is located at an end portion of the support 26 on the side opposite the semiconductor chip 1. Each concave portion 28 is located between two band-shaped portions 27 adjacent to each other in the direction Y.

The mounting lead 3 is different from that of the semiconductor device 100 in that two concave portions 38 are formed in a support 36. Each concave portion 38 has a shape dented from a mounting lead main surface 31 into a mounting lead bottom 32. Each concave portion 38 is located at an end portion of the support 36 on the side opposite the semiconductor chip 1. One of the two concave portions 38 is located between two band-shaped portions 37 in the direction Y.

Figure 21:
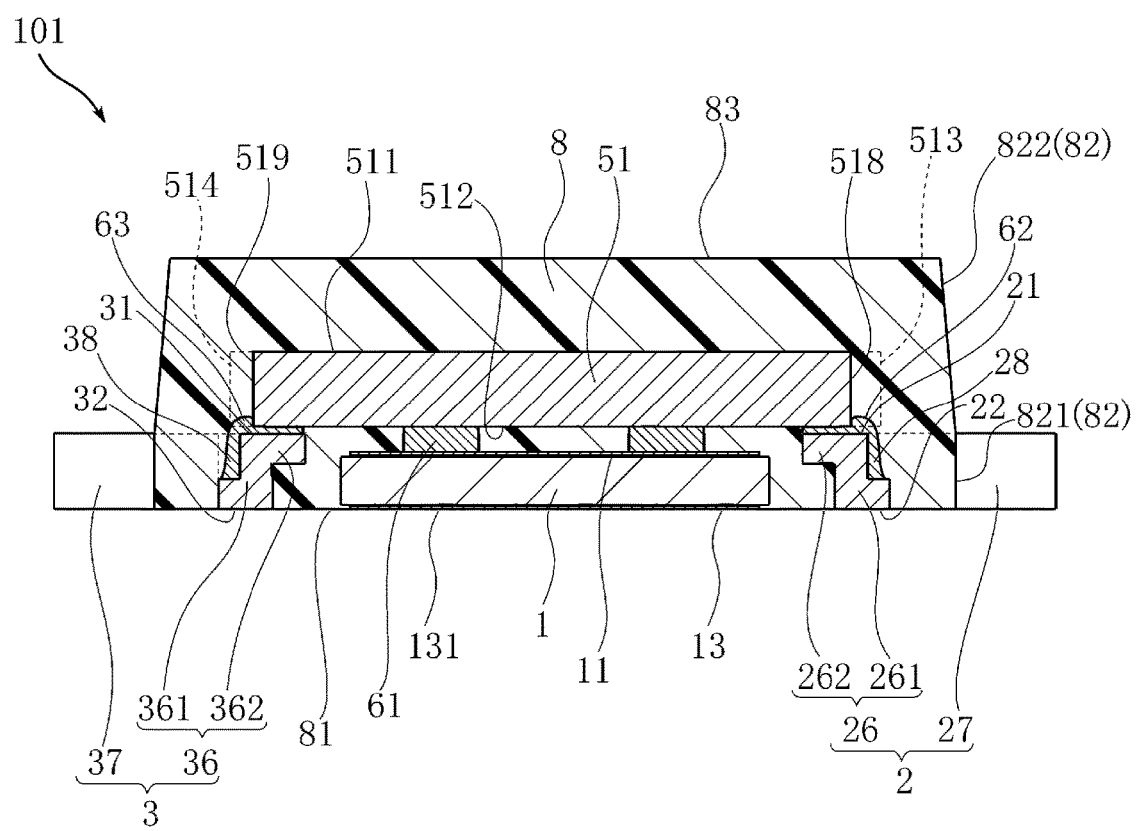
FIG. 21 is a sectional view taken along line XXI-XXI in FIG. 20.

As shown in FIG. 21, the conductive bonding 62 of this modification may get into each concave portion 28. Similarly, the conductive bonding 63 of this modification may get into the concave portion 38.

With this configuration, in manufacturing the semiconductor device 101, a self-alignment effect of the connection lead 51 by conductive bonding materials 67 can be expected by inserting the conductive bonding materials 67 in the concave portions 28 and 38 in addition to concave portions 518 and 519. In addition, such insertion can prevent the connection lead 51 from being inclined with respect to the XY plane.

<Second Modification of Semiconductor Device according to First Embodiment>

A second modification of the semiconductor device of this embodiment will be now described with reference to FIG. 22.

FIG. 22 is a sectional view of a semiconductor device according to the second modification.

As shown in FIG. 22, a semiconductor device 102 includes a semiconductor chip 1, mounting leads 2 to 4, connection leads 51 and 52, conductive bondings 61 to 65 and a resin portion 8. In the semiconductor device 102, the semiconductor chip 1, the mounting leads 2 to 4, the connection lead 52, the conductive bondings 61 to 65 and the resin portion 8 have the same configuration as those of the above-described semiconductor device 100 except for connection lead 51, and therefore, explanations of the same configurations will not be repeated. In this modification, the semiconductor chip 1 has the same thickness as that of the mounting leads 2 to 4.

In the connection lead 51, a connection lead rear surface 512 has a chip opposite side 571 and mounting lead opposite sides 572 and 573. The chip opposite side 571 faces a main surface electrode 11 of the semiconductor chip 1. The conductive bonding 61 is interposed between the chip opposite side 571 and an electrode surface 111 of the main surface electrode 11. The chip opposite side 571 and the electrode surface 111 are bonded to each other by means of the conductive bonding 61. Similarly, the mounting lead opposite side 572 faces a mounting lead main surface 21 of the mounting lead 2. The conductive bonding 62 is interposed between the chip opposite side 572 and the mounting lead main surface 21. The mounting lead opposite side 572 and the mounting lead main surface 21 are bonded to each other by means of the conductive bonding 62. Similarly, the mounting lead opposite side 573 faces a mounting lead main surface 31 of the mounting lead 3. The conductive bonding 63 is interposed between the chip opposite side 573 and the mounting lead main surface 31. The mounting lead opposite side 573 and the mounting lead main surface 31 are bonded to each other by means of the conductive bonding 63.

The chip opposite side 571 is located in the direction Za from the mounting lead opposite sides 572 and 573 (i.e., the upper side in FIG. 22). Accordingly, the distance between the chip opposite side 571 and the electrode surface 111 (the dimension of the conductive bonding 61 in the direction Z) is larger than either the distance between the mounting lead opposite side 572 and the mounting lead main surface 21 (the dimension of the conductive bonding 62 in the direction Z) and the distance between the mounting lead opposite side 573 and the mounting lead main surface 31 (the dimension of the conductive bonding 63 in the direction Z). The connection lead 51 has the same configuration as that of the semiconductor device 100 except its sectional shape, and therefore, explanation of which will not be repeated.

The configuration of the second modification may be combined with the configuration of the first modification.

<Third Modification of Semiconductor Device according to First Embodiment>

A third modification of the semiconductor device of this embodiment will be now described with reference to FIG. 23.

Figure 23:
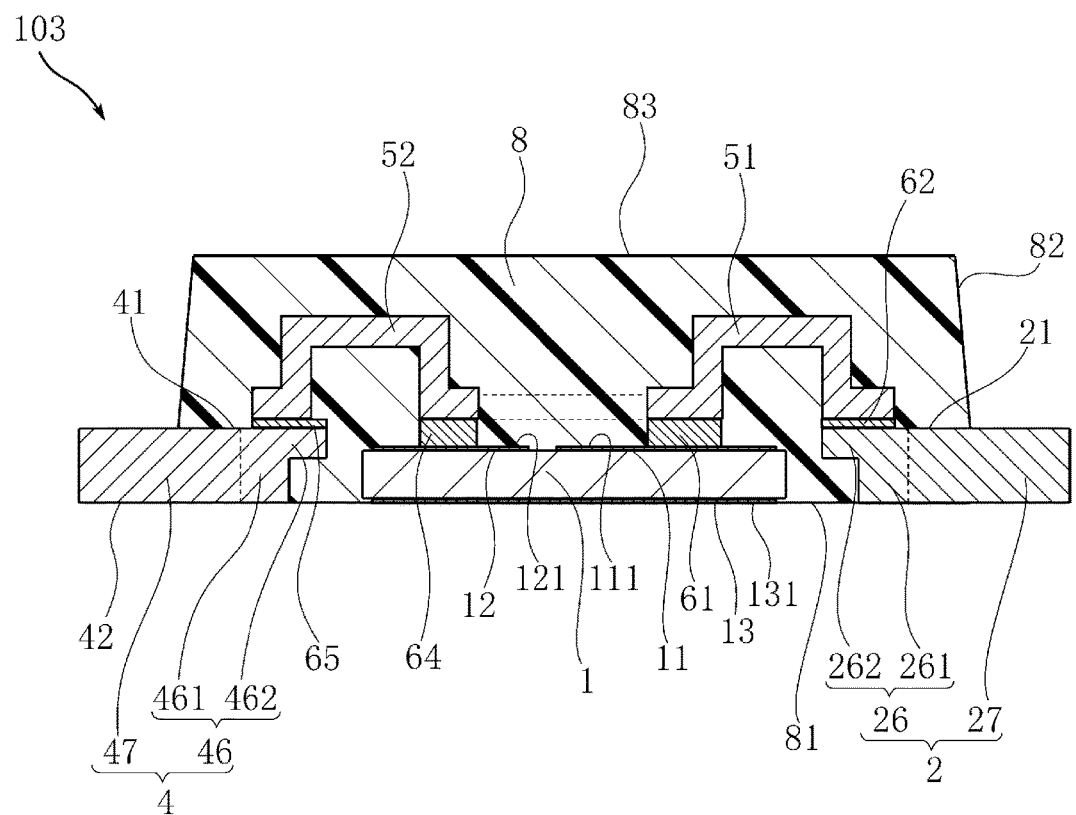
FIG. 23 is a sectional view of the semiconductor device according to a third modification of the first embodiment.

FIG. 23 is a sectional view of a semiconductor device according to the third modification.

As shown in FIG. 23, a semiconductor device 103 includes a semiconductor chip 1, mounting leads 2 to 4, connection leads 51 and 52, conductive bondings 61 to 65 and a resin portion 8. In the semiconductor device 103, the semiconductor chip 1, the mounting leads 2 to 4, the conductive bondings 61 to 65 and the resin portion 8 have the same configuration as those of the above-described semiconductor device 100 except for the connection leads 51 and 52, and therefore, explanations of the same configurations will not be repeated. The semiconductor device 103 has the same configuration as the semiconductor device 100 except that the connection leads 51 and 52 have a U-like section.

With this configuration, since the connection leads 51 and 52 are bent when the connection leads 51 and 52 are placed on the semiconductor chip 1 and so on, it is difficult to exert a force from the connection leads 51 and 52 to the semiconductor chip 1. This can prevent the semiconductor chip 1 from being damaged due to a force being exerted on the semiconductor chip 1 when the connection leads 51 and 52 are bonded to the semiconductor chip 1 and so on.

The configuration of the third modification may be combined with the configurations of the first and second modifications.

<Fourth Modification of Semiconductor Device according to First Embodiment>

A fourth modification of the semiconductor device of this embodiment will be now described with reference to FIGS. 24 to 28.

Figure 25:
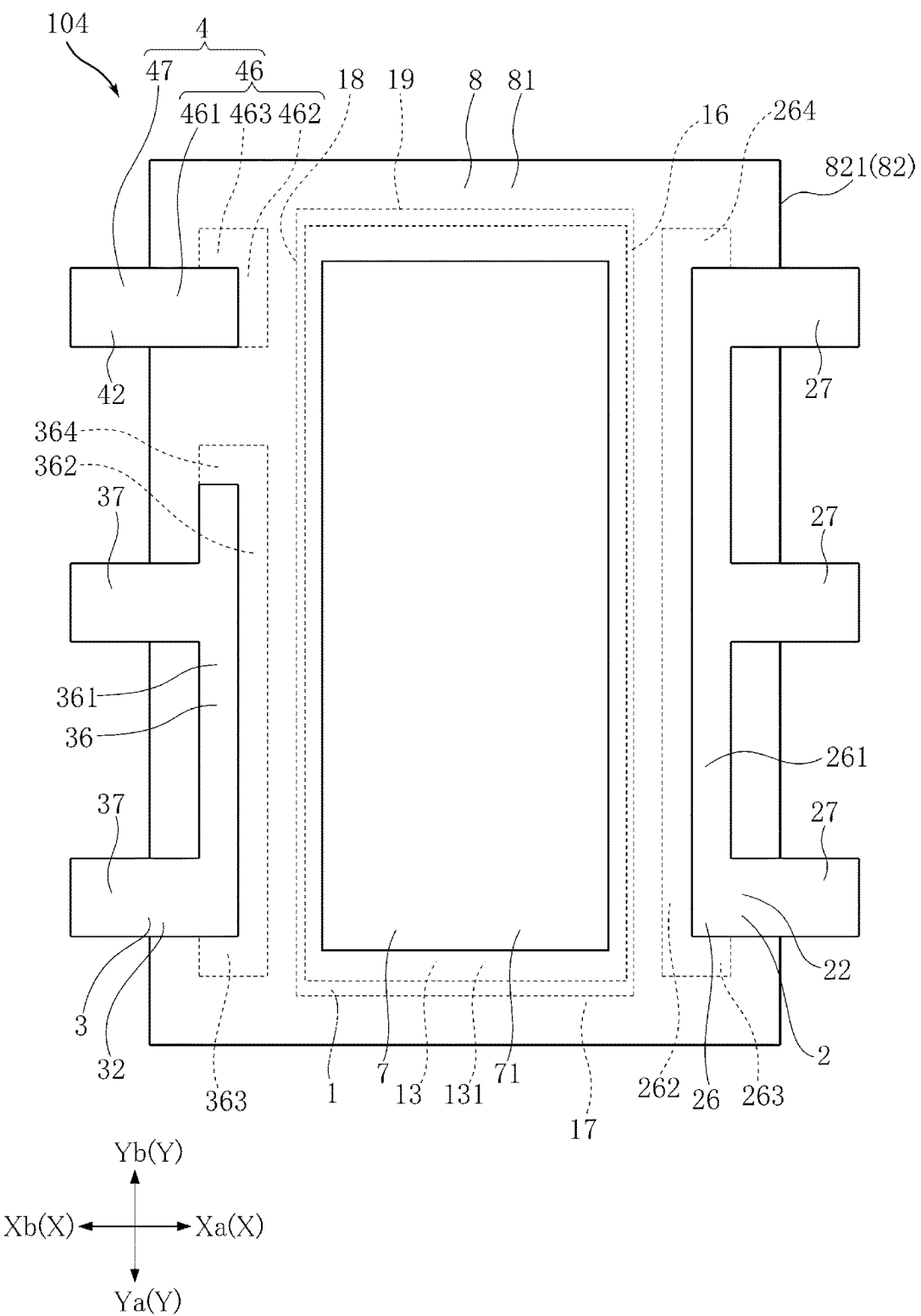
FIG. 25 is a bottom view of the semiconductor device shown in FIG. 24.

FIG. 24 is a sectional view of a semiconductor device according to the fourth modification of the first embodiment. FIG. 25 is a bottom view of the semiconductor device shown in FIG. 24.

As shown in these figures, a semiconductor device 104 includes a semiconductor chip 1, mounting leads 2 to 4, connection leads 51 and 52, conductive bondings 61 to 65 and a resin portion 8 and is different from the semiconductor device 100 in that the semiconductor device 104 further includes a conductive layer 7.

The conductive layer 7 makes direct contact with an electrode surface 131 of a rear surface electrode 13. Accordingly, the conductive layer 7 makes electrical conduction with the rear surface electrode 13. The conductive layer 7 is made of, for example, solder (Pb-based, Sn-based, or Bi-based) or silver paste. The conductive layer 7 is exposed from a resin bottom 81. The conductive layer 7 has a plane 71 which is flush with the resin bottom 81. The conductive layer 7 overlaps with the semiconductor chip 1 when viewed in the direction Z. In addition, the semiconductor chip 1 has a portion projecting from the conductive layer 7 when viewed in the direction Z. That is, the semiconductor chip 1 has a portion which does not overlap with the conductive layer 7 when viewed in the direction Z. The portion of the semiconductor chip 1 which does not overlap with the conductive layer 7 is covered with the resin portion 8. In this modification, the area of the conductive layer 7 when viewed in the direction Z is smaller than the area of the semiconductor chip 1 when viewed in the direction Z. In addition, the conductive layer 7 overlaps with the semiconductor chip 1 over its entire area when viewed in the direction Z. Thickness (dimension in the direction Z) of the conductive layer 7 is, for example, 10 to 100 μm.

Next, a method for manufacturing the semiconductor device 104 will be described in brief.

Figure 26:
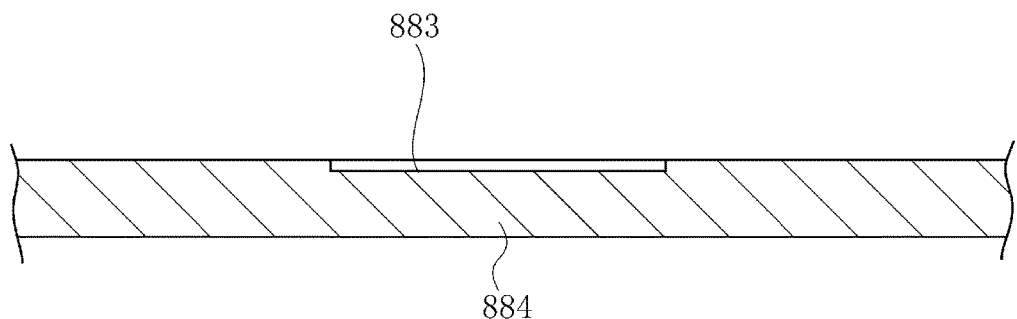
FIG. 26 is a main part sectional view showing one process in a manufacturing method of the semiconductor device according to the fourth modification of the first embodiment.

As shown in FIG. 26, a member 884 having a concave portion 883 is first prepared. The member 884 is made of a material which does not react with the material of the conductive layer 7. If the conductive layer 7 is made of solder, the material of the member 884 may be, for example, Al.

Figure 27:
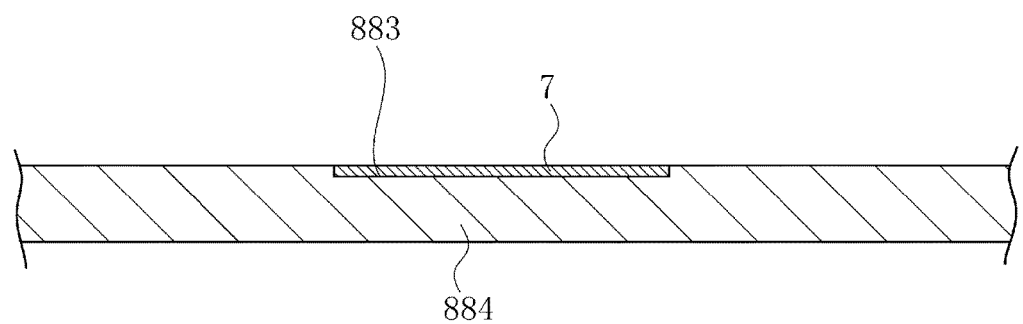
FIG. 27 is a main part sectional view showing a process subsequent to FIG. 26.
Figure 28:
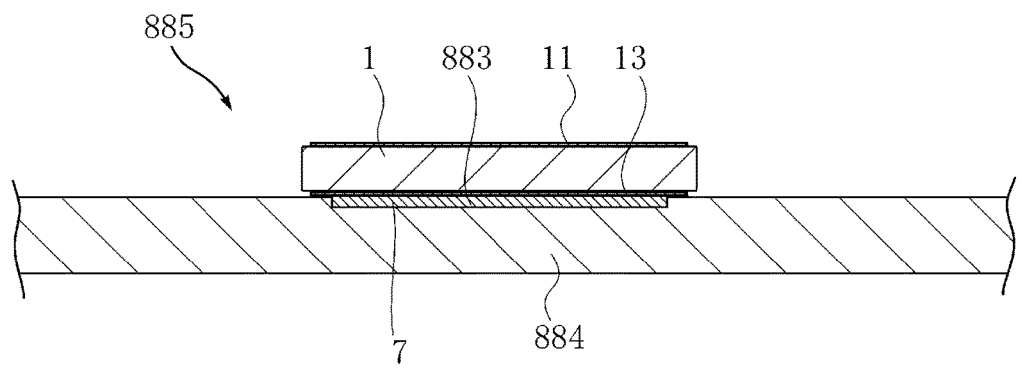
FIG. 28 is a main part sectional view showing a process subsequent to FIG. 27.

Next, as shown in FIG. 27, the conductive layer 7 is formed in the concave portion 883. Next, as shown in FIG. 28, the semiconductor chip 1 is placed on the member 884 through the conductive layer 7. After the conductive layer 7 is bonded to the semiconductor chip 1, the member 884 is removed from the semiconductor chip 1 and the conductive layer 7. Thus, a solid piece 885 including the conductive layer 7 and the semiconductor chip 1 which are bonded to each other is completed.

When the solid piece 885 is completed, the semiconductor device 104 can be manufactured by performing the same processes as the method for manufacturing the semiconductor device 100 which has been described with reference to FIGS. 9 to 19. This modification is different from the method for manufacturing the semiconductor device 100 in that, instead of the semiconductor chip 1, the solid piece 885 is bonded to a tape 881.

Next, operation and effects of the fourth modification will be described.

The semiconductor device 104 includes the conductive layer 7 exposed from the resin bottom 81. In addition, the conductive layer 7 makes direct contact with the electrode surface 131 of the rear surface electrode 13. With this configuration, the conductive layer 7 may be formed separately from the semiconductor chip 1 including the rear surface electrode 13. Accordingly, the conductive layer 7 may be formed to have a desired shape without being limited to the shape of the rear surface electrode 13. For example, in this modification, the conductive layer 7 is formed to have an area smaller than the area of the semiconductor chip 1 when viewed in the direction Z. If the area of the conductive layer 7 when viewed in the direction Z is smaller than the area of the semiconductor chip 1 when viewed in the direction Z, a solder layer connected to the conductive layer 7 can be prevented from contacting the solder layer 108 bonded to the mounting lead 2 when the semiconductor device 104 is mounted on the circuit board 106. This can prevent the conductive layer 7 making electrical conduction with the rear surface electrode 13 from making electrical conduction with the solder layer 108. Similarly, this can prevent the conductive layer 7 from making electrical conduction with the solder layer 109. Thus, there is no need to excessively increase the dimension of the semiconductor device 104 in the direction X even if the dimension of the semiconductor chip 1 in the direction X is increased.

The configuration of the fourth modification may be combined with the configurations of the first to third modifications.

<Fifth Modification of Semiconductor Device according to First Embodiment>

A fifth modification of the semiconductor device of this embodiment will be now described with reference to FIG. 29.

Figure 29:
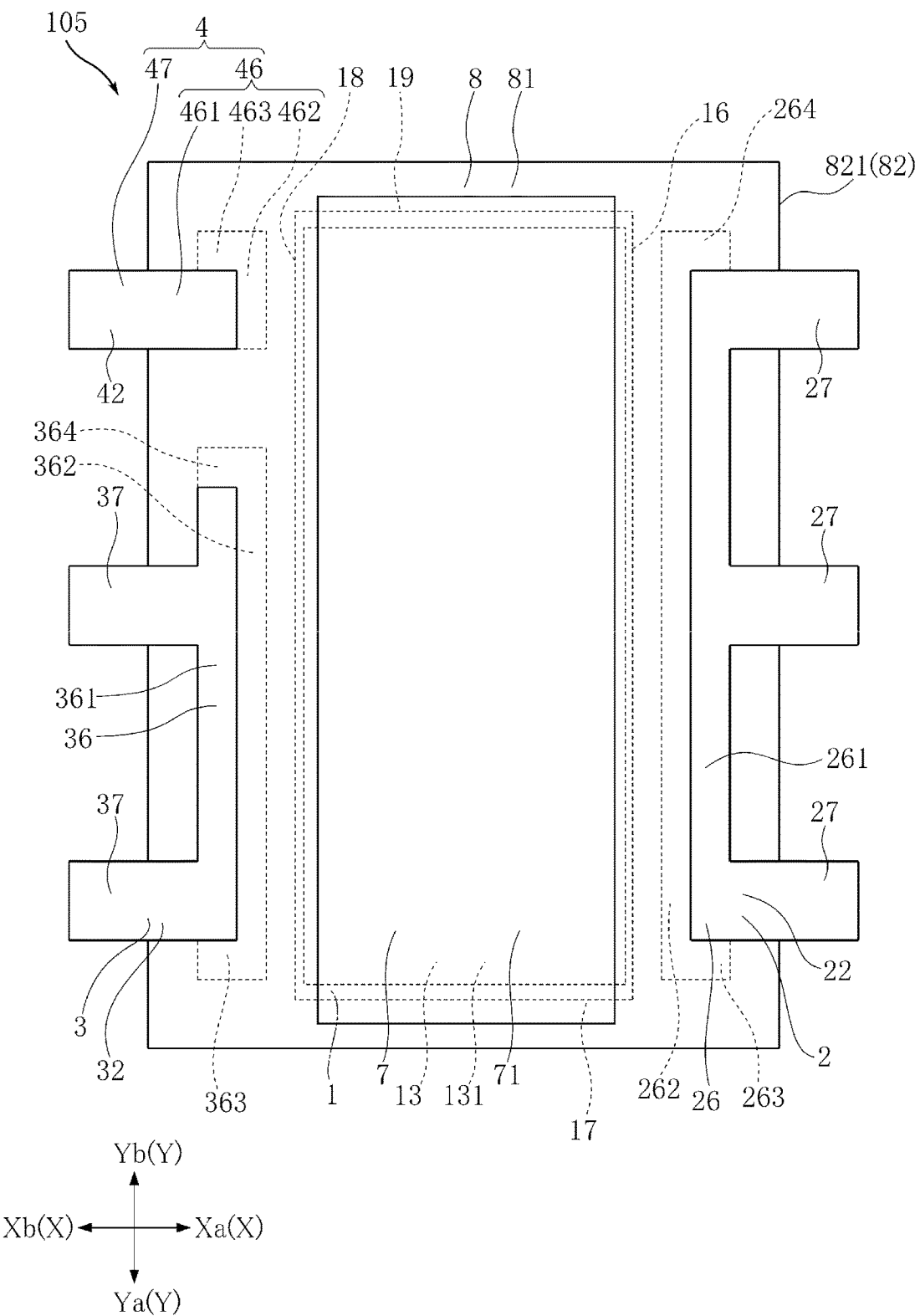
FIG. 29 is a bottom view of the semiconductor device according to a fifth modification of the first embodiment.

FIG. 29 is a bottom view of a semiconductor device according to the fifth modification.

A semiconductor device 105 shown in FIG. 29 is different from the semiconductor device 104 in terms of the shape of the conductive layer 7 when viewed in the direction Z. In this modification, the area of the conductive layer 7 when viewed in the direction Z is larger than the area of the semiconductor chip 1 when viewed in the direction Z. Accordingly, the conductive layer 7 projects from the semiconductor chip 1 in the directions Ya and Yb when viewed in the direction Z. Like the semiconductor device 104, also in this modification, the conductive layer 7 overlaps with the semiconductor chip 1 when viewed in the direction Z.

Also in this modification, the conductive layer 7 may be formed separately from the semiconductor chip 1 including the rear surface electrode 13. Accordingly, the conductive layer 7 may be formed to have a desired shape without being limited to the shape of the rear surface electrode 13. For example, in this modification, the conductive layer 7 is formed to have an area larger than the area of the semiconductor chip 1 when viewed in the direction Z. If the area of the conductive layer 7 when viewed in the direction Z is larger than the area of the semiconductor chip 1 when viewed in the direction Z, heat generated in the semiconductor chip 1 can be rapidly emitted out of the semiconductor device 105.

The configuration of the fifth modification may be combined with the configurations of the first to third modifications.

Detailed configuration of components of the semiconductor device according to the first embodiment can be freely designed in different ways. For example, the mounting electrodes may have a band shape extending in the direction X without being limited to the shape described above. It has been illustrated in the first embodiment that the mounting lead 2 is separated from the semiconductor chip 1 in the direction Xa and the mounting lead 3 is separated from the semiconductor chip 1 in the direction Xb. However, the mounting lead 2 may be separated from the semiconductor chip 1 in the direction Xa and the mounting lead 3 may be separated from the semiconductor chip 1, for example, in the direction Ya. Although it has been illustrated in the above description that one semiconductor chip 1 is covered with the resin portion 8, a plurality of semiconductor chips may be covered with a resin portion which is then diced.

<Second Embodiment>

FIG. 30 is a sectional view showing a mount structure of a semiconductor device according to a second embodiment of the present disclosure.

As shown in FIG. 30, a mount structure 802 includes a semiconductor device 200, a circuit board 206 and solder layers 207 to 209.

An example of the circuit board 206 may include a printed circuit board. The circuit board 206 includes, for example, an insulating substrate and patterned electrodes formed on the insulating substrate. The semiconductor device 200 is mounted on the circuit board 206. The solder layers 207 to 209 are interposed between the semiconductor device 200 and the circuit board 206. The solder layers 207 to 209 are bonded to the semiconductor device 200 and the circuit board 206.

Figure 31:
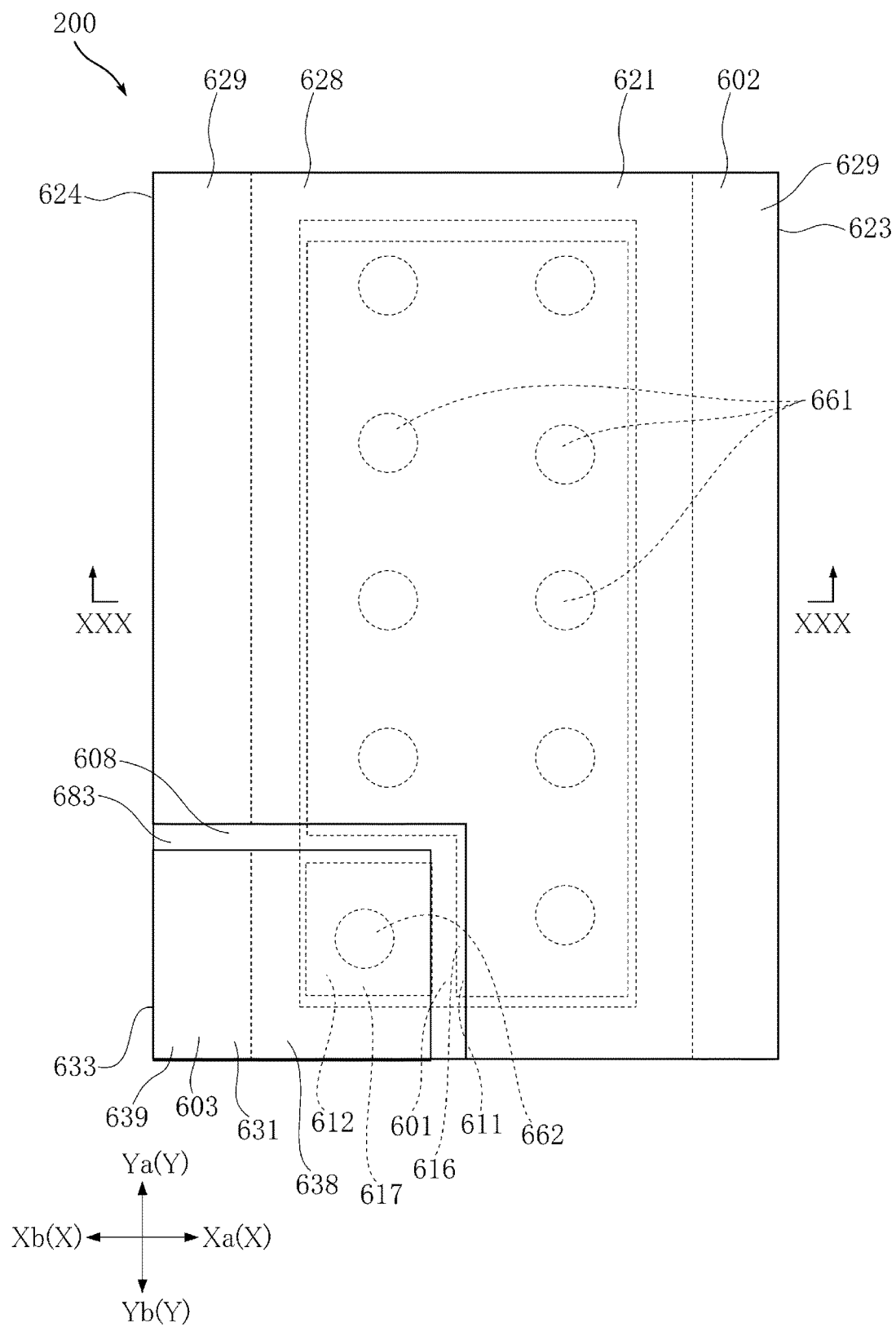
FIG. 31 is a plan view (partially shown transparently) of the semiconductor device shown in FIG. 30.
Figure 33:
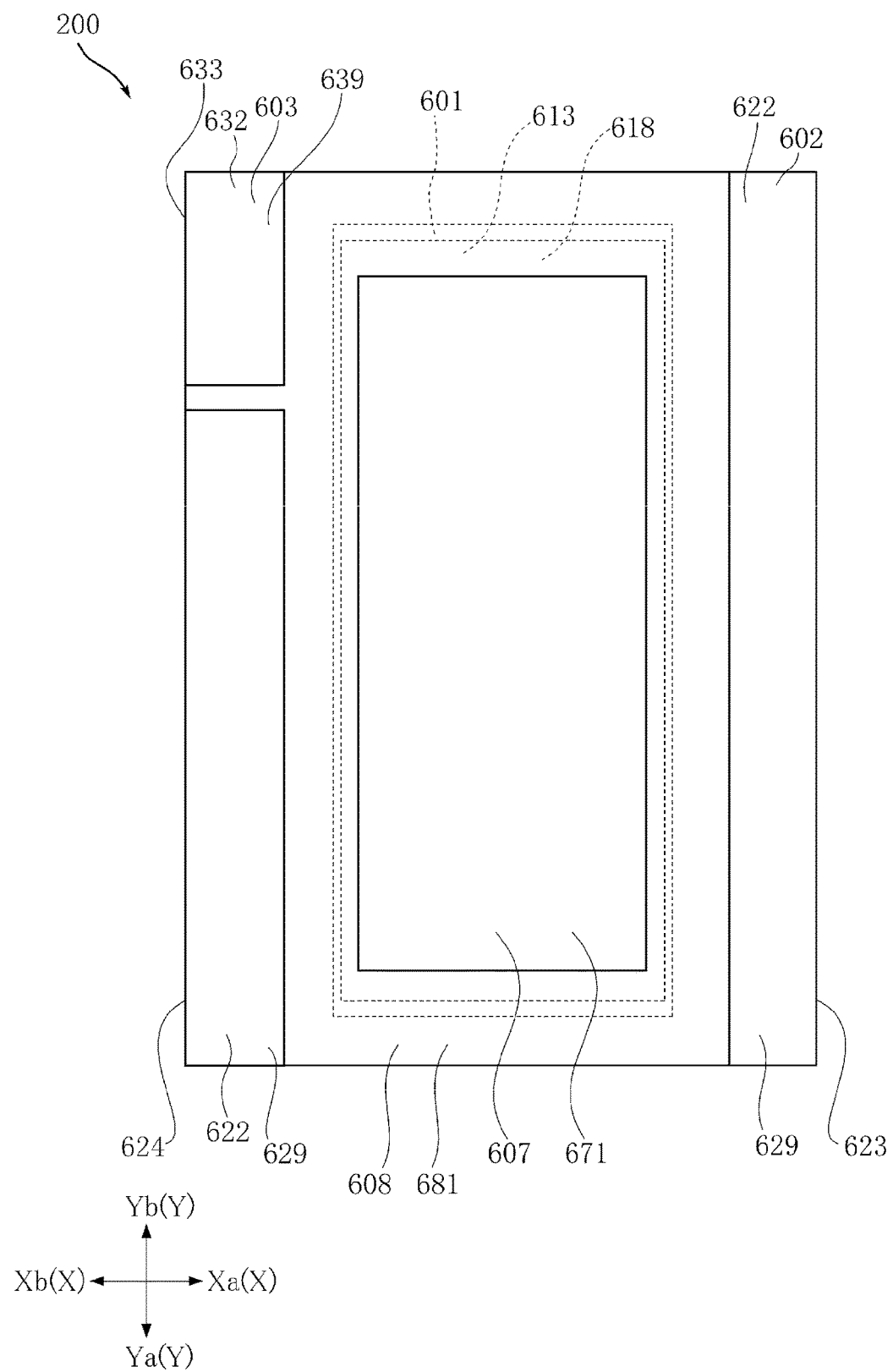
FIG. 33 is a bottom view of the semiconductor device shown in FIG. 31.

FIG. 31 is a plan view (partially shown transparently) of the semiconductor device shown in FIG. 30. FIG. 32 is a front view of the semiconductor device shown in FIG. 31. FIG. 33 is a bottom view of the semiconductor device shown in FIG. 31. FIG. 30 also shows a sectional view of the semiconductor device 200, which is taken along line XXX-XXX in FIG. 31.

The semiconductor device 200 shown in these figures includes a semiconductor chip 601, leads 602 and 603, conductive bondings 661 and 662 and a resin portion 608.

The semiconductor chip 601 shown in FIGS. 30 to 33 is a device made of a semiconductor. An example of the semiconductor chip 601 may include a diode, a transistor and an IC. In this embodiment, the semiconductor chip 601 is a transistor. The semiconductor chip 601 has a rectangular shape when viewed from above. The semiconductor chip 601 has chip sides 16 to 19. The chip side 16 has a planar shape widened in a YZ plane and faces one of directions X (hereinafter referred to as "direction Xa"). The thickness (the dimension in the direction Z) of the semiconductor chip 601 is, for example, 200 μm. The dimension in the direction X of the semiconductor chip 601 is, for example, 2000 μm and the dimension in the direction Y of the semiconductor chip 601 is, for example, 4000 μm.

The semiconductor chip 601 includes main surface electrodes 611 and 612 and a rear surface electrode 613. The main surface electrode 611 has an electrode surface 616. The main surface electrode 612 has an electrode surface 617. The electrode surfaces 616 and 617 faces one of the thickness directions Z of the semiconductor chip 601 (hereinafter referred to as "direction Za"). The rear surface electrode 613 has an electrode surface 618. The electrode surface 618 faces the other of the thickness directions Z of the semiconductor chip 601 (hereinafter referred to as "direction Zb").

In this embodiment, the main surface electrode 611 is a source electrode, the main surface electrode 612 is a gate electrode and the rear surface electrode 613 is a drain electrode. As an alternative embodiment, the main surface electrode 611 in the semiconductor chip 601 may be, for example, a drain electrode or the like. If the semiconductor chip 601 is a diode, the semiconductor chip 601 may not include the main surface electrode 612. If the semiconductor chip 601 is an IC, the semiconductor chip 601 may include more main surface electrodes in addition to the above-mentioned two main surface electrodes 611 and 612.

The leads 602 and 603 shown in FIGS. 30 to 33 are used to mount the semiconductor device 200 on the circuit board 206. The leads 602 and 603 are made of a conductor such as, for example, copper. The lead 602 makes electrical conduction with the main surface electrode 611 and the lead 603 makes electrical conduction with the main surface electrode 612, as will be described later.

The lead 602 includes a first portion 628 and two second portions 629. The dimension of the first portion 628 in the direction Z is smaller than the dimension of each second portion 629 in the direction Z. The first portion 628 faces the main surface electrode 611 of the semiconductor chip 601.

The first portion 628 is located between the two second portions 629 when viewed in the direction Z.

The lead 602 has a lead main surface 621, two lead bottoms 622 and two lead sides 623 and 624.

The lead main surface 621 and the lead bottoms 622 have a planar shape widened in the XY plane. The lead main surface 621 faces the direction Za and the lead bottoms 622 faces the direction Zb. That is, the lead main surface 621 and the lead bottoms 622 face in opposite directions. The lead main surface 621 is constituted by the first portion 628 and the second portions 629. The lead bottoms 622 are constituted by the second portions 629. As shown in FIG. 30, when the semiconductor device 200 is mounted on the circuit board 206, the lead bottoms 622 can be bonded to a wiring layer of the circuit board 206 via the solder layers 208 and 209. This allows the lead 602 to make electrical conduction with the wiring layer of the circuit board 206.

The lead sides 623 and 624 have a planar shape widened in the YZ plane. The lead side 623 faces the direction Xa and the lead side 624 faces the other direction of the directions X (hereinafter referred to as "direction Xb"). That is, the lead sides 623 and 624 face in opposite directions. The lead side 623 is constituted by one of the two second portions 629 and the lead side 624 is constituted by the other of the two second portions 629. The lead sides 623 and 624 are exposed from the resin portion 608, which will be described later, without being covered with the resin portion 608.

As shown in FIGS. 31 to 33, the lead 603 includes a first portion 638 and a second portion 639. The dimension of the first portion 638 in the direction Z is smaller than the dimension of the second portion 639 in the direction Z. The first portion 638 faces the main surface electrode 612 of the semiconductor chip 601.

The lead 603 has a lead main surface 631, a lead bottom 632 and a lead side 633.

The lead main surface 631 and the lead bottom 632 have a planar shape widened in the XY plane. The lead main surface 631 faces the direction Za and the lead bottom 632 faces the direction Zb. That is, the lead main surface 631 and the lead bottom 632 face in opposite directions. The lead main surface 631 is constituted by the first portion 638 and the second portion 639. The lead bottom 632 is constituted by the second portion 639. When the semiconductor device 200 is mounted on the circuit board 206, the lead bottom 632 can be bonded to a wiring layer of the circuit board 206 via a solder layer (not shown). This allows the lead 603 to make electrical conduction with the wiring layer of the circuit board 206.

The lead side 633 has a planar shape widened in the YZ plane. The lead side 633 faces the direction Xb. The lead side 633 is constituted by the second portion 639. The lead side 633 is exposed from the resin portion 608, which will be described later, without being covered with the resin portion 608.

Each of the conductive bondings 661 and 662 is made of a conductor. An example of the conductor of which each conductive bonding 661 and 662 is made may include solder, silver and so on. In this embodiment, the conductor of which each conductive bonding 661 and 662 is made is solder.

The conductive bonding 661 is interposed between the first portion 628 of the lead 602 and the main surface electrode 611 (the electrode surface 616). The conductive bonding 661 is used to bond the lead 602 to the main surface electrode 611. The conductive bonding 661 makes direct contact with the lead 602 and the main surface electrode 611. The lead 602 makes electrical conduction with the main surface electrode 611 via the conductive bonding 661. Accordingly, in this embodiment, the lead 602 becomes a source electrode.

The conductive bonding 662 is interposed between the first portion 638 of the lead 603 and the main surface electrode 612 (the electrode surface 617). The conductive bonding 662 is used to bond the lead 603 to the main surface electrode 612. The conductive bonding 662 makes direct contact with the lead 603 and the main surface electrode 612. The lead 603 makes electrical conduction with the main surface electrode 612 via the conductive bonding 662. Accordingly, in this embodiment, the lead 603 becomes a gate electrode.

A conductive layer 607 shown in FIGS. 30, 32 and 33 makes direct contact with the electrode surface 618 of the rear surface electrode 613. The conductive layer 607 is made of, for example, solder (Pb-based, Sn-based, or Bi-based) or silver paste. The conductive layer 607 is exposed from a resin bottom 681, which will be described later. The conductive layer 607 has a plane 671. As shown in FIG. 33, the conductive layer 607 overlaps with the semiconductor chip 601 when viewed in the direction Z. In addition, the semiconductor chip 601 has a portion projecting from the conductive layer 607 when viewed in the direction Z. That is, the semiconductor chip 601 has a portion which does not overlap with the conductive layer 607 when viewed in the direction Z. The portion of the semiconductor chip 601 which does not overlap with the conductive layer 607 is covered with the resin portion 8, which will be described later. In this embodiment, the area of the conductive layer 607 when viewed in the direction Z is smaller than the area of the semiconductor chip 601 when viewed in the direction Z. In addition, the conductive layer 607 overlaps with the semiconductor chip 601 overall when viewed in the direction Z. The thickness (dimension in the direction Z) of the conductive layer 607 is, for example, 10 to 100 μm.

The resin portion 608 covers the semiconductor chip 601, the leads 602 and 603 and the conductive bondings 661 and 662. The resin portion 608 is made of, for example, black epoxy resin. As shown in FIG. 32, the resin portion 608 has the resin bottom 681 and a resin main surface 683. The resin bottom 681 has a planar shape widened in the XY plane and faces the direction Zb. The lead bottoms 622 and 632 and the plane 671 are exposed from the resin bottom 681. The resin bottom 681, the lead bottoms 622 and 632 and the plane 671 lie on the same plane.

The resin main surface 683 has a planar shape widened in the XY plane. The lead main surfaces 621 and 631 are exposed from the resin main surface 683. It is shown in FIG. 32 that the resin main surface 683 and the lead main surfaces 621 and 631 lie on the same plane. As an alternative embodiment, the lead main surfaces 621 and 631 may be covered with the resin portion 608 without being exposed at the resin main surface 683.

In this embodiment, the lead sides 623, 624 and 633 are exposed at the resin portion 608.

Next, an exemplary method for manufacturing the semiconductor device 200 will be described in brief with reference to FIGS. 34 to 44.

Figure 34:
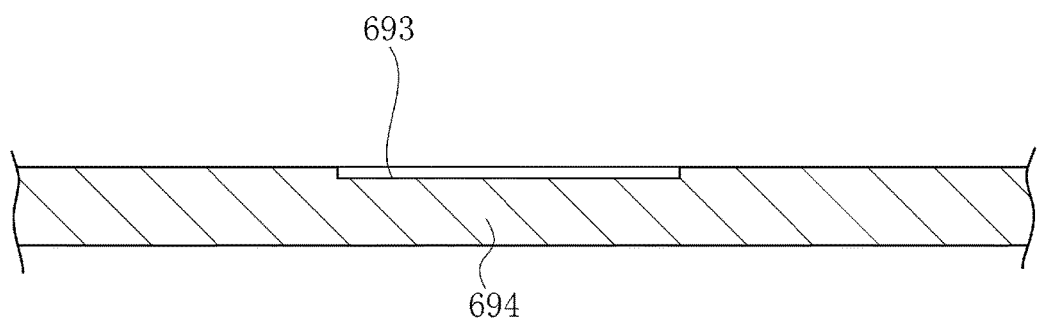
FIG. 34 is a main part sectional view showing one process in a manufacturing method of the semiconductor device according to the second embodiment.

As shown in FIG. 34, a member 694 having a concave portion 693 is first prepared. The member 694 is made of a material which does not react with the material of the conductive layer 607. If the conductive layer 607 is made of solder, the material of the member 694 may be, for example, Al.

Figure 35:
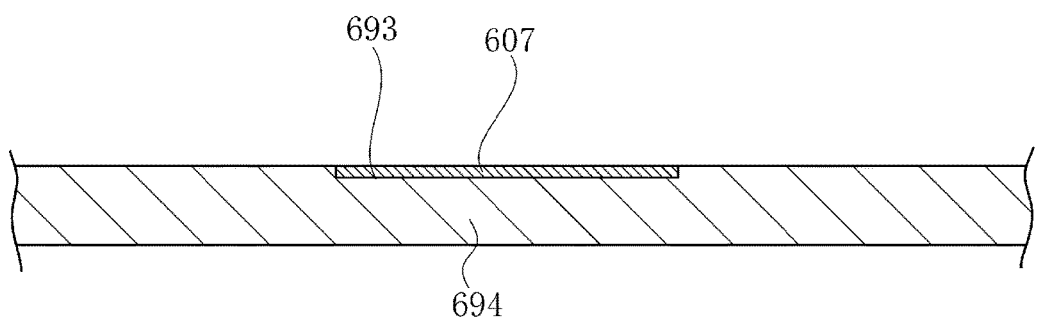
FIG. 35 is a main part sectional view showing a process subsequent to FIG. 34.
Figure 36:
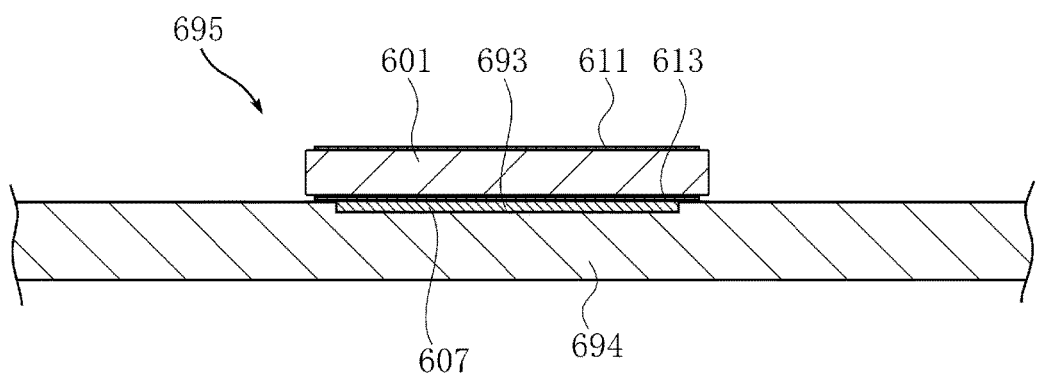
FIG. 36 is a main part sectional view showing a process subsequent to FIG. 35.

Next, as shown in FIG. 35, the conductive layer 607 is formed in the concave portion 693. Next, as shown in FIG.

36, the semiconductor chip 601 is placed on the member 694 through the conductive layer 607. After the conductive layer 607 is bonded to the semiconductor chip 601, the member 694 is removed from the semiconductor chip 601 and the conductive layer 607. Thus, a plurality of solid pieces 695 each including the conductive layer 607 and the semiconductor chip 601 which are bonded to each other may be completed.

Figure 37:
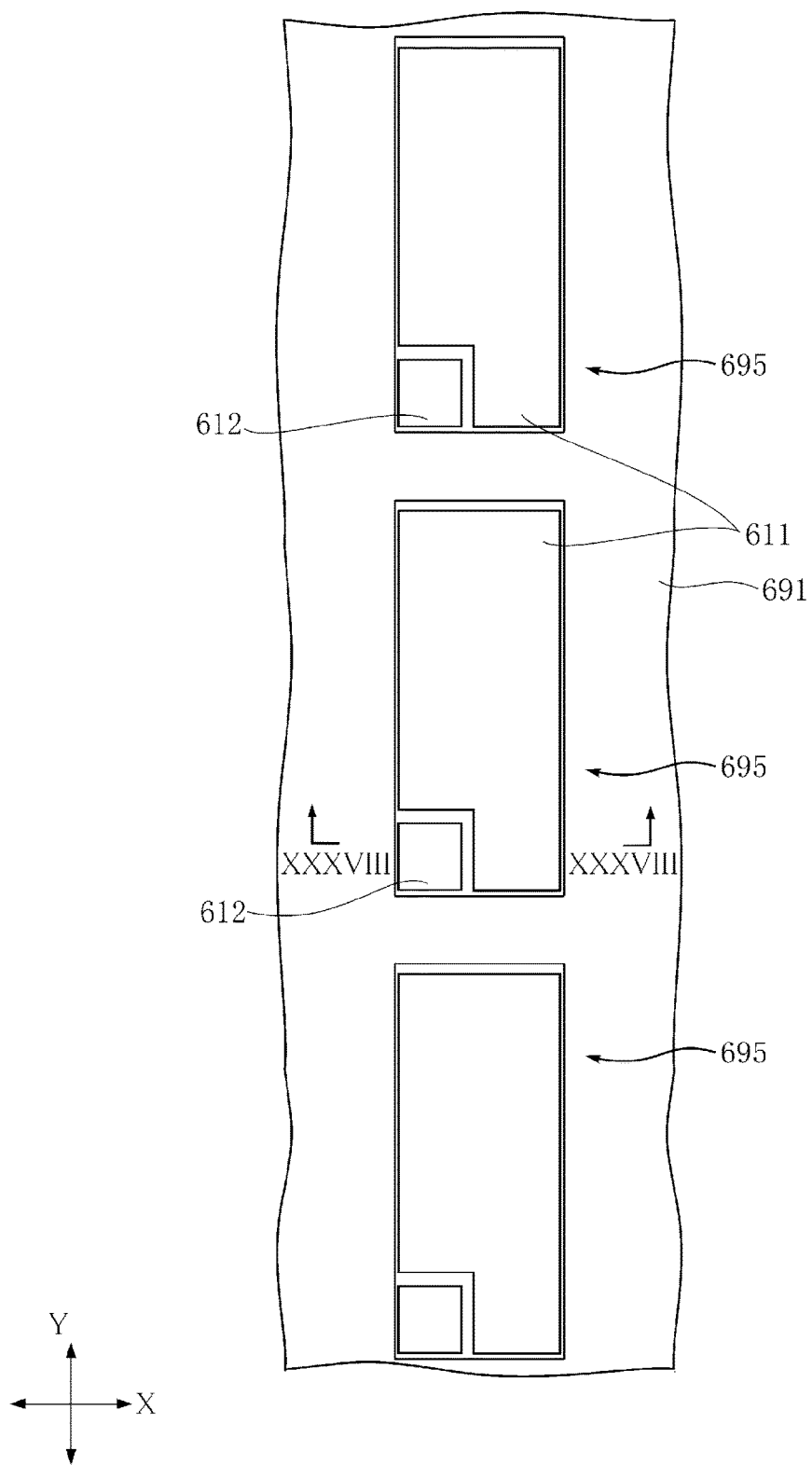
FIG. 37 is a main part plan view showing one process in the manufacturing method of the semiconductor device according to the second embodiment.

Next, as shown in FIGS. 37 and 38, a tape 691 is prepared. The tape 691 is a heat resistant tape made of, for example, polyimide. TRM6250 available from Nitto Denko Cooperation may be used for the heat resistant tape. Next, the plurality of solid pieces 695 is bonded to the tape 691. The plurality of solid pieces 695 is arranged on the tape 691 along the direction Y. For bonding of the solid pieces 695 to the tape 691, the plane 671 of the conductive layer 607 is bonded to the tape 691. This prevents resin burrs from being formed in the plane 671 in a process of forming a resin portion 680, which will be described later.

Figure 39:
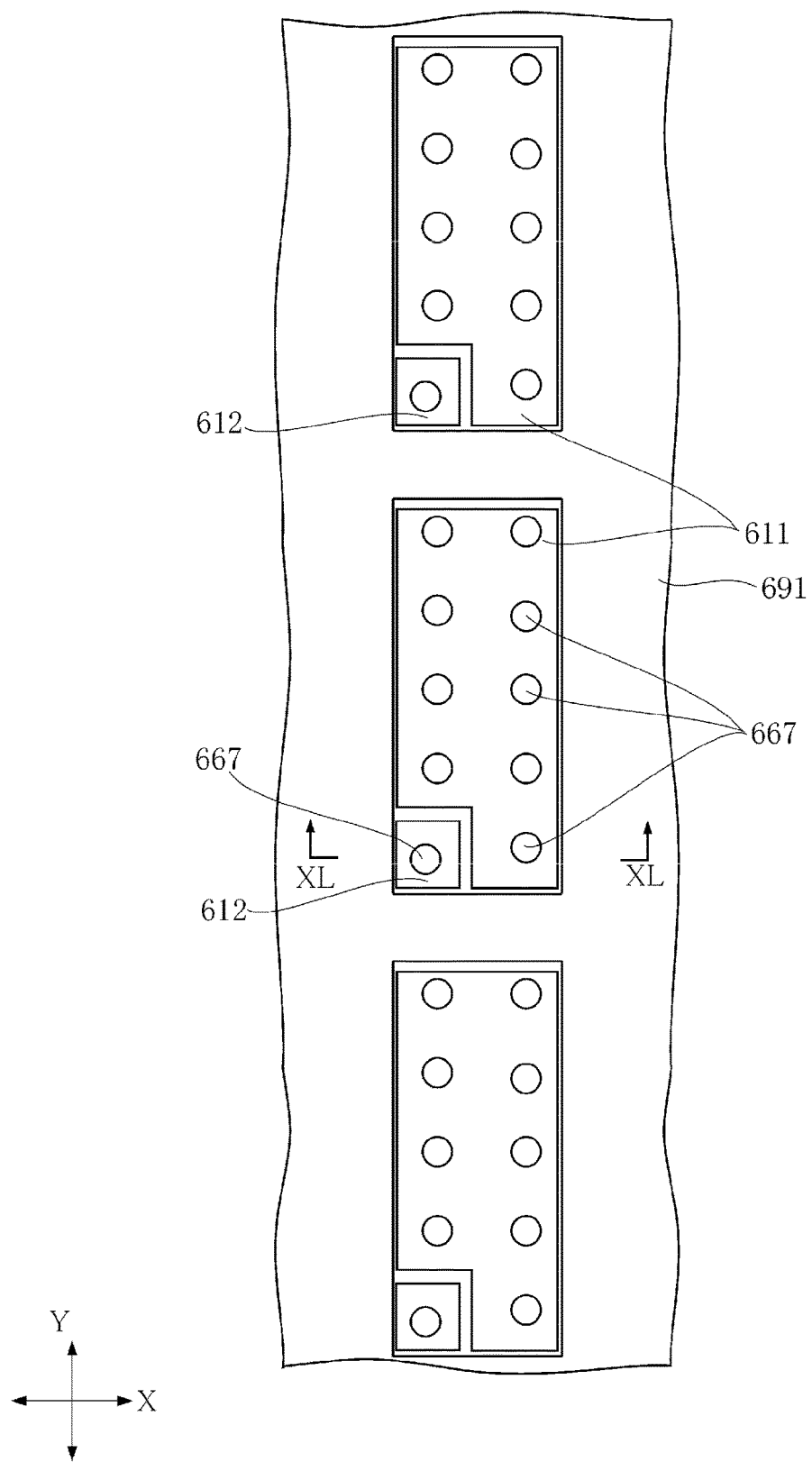
FIG. 39 is a main part plan view showing a process subsequent to FIG. 37.
Figure 40:
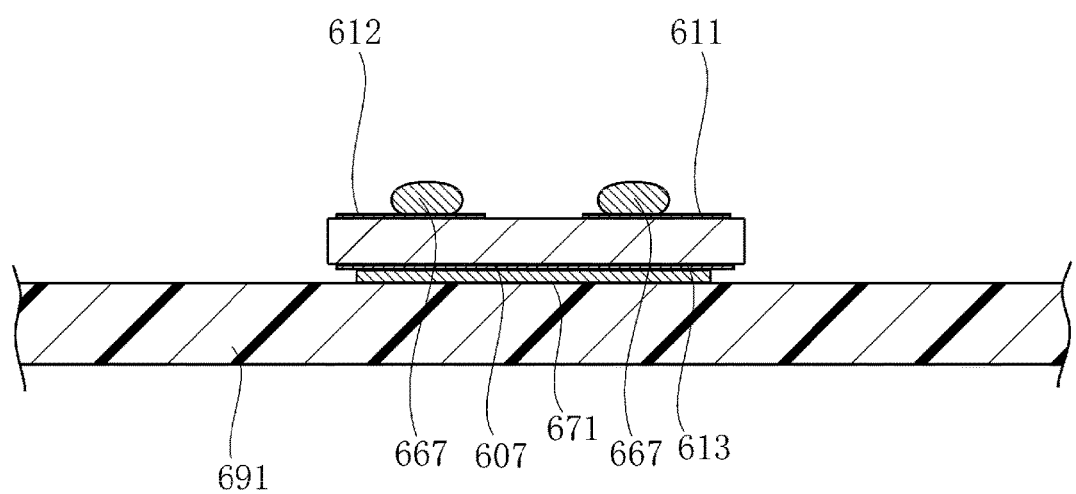
FIG. 40 is a main part sectional view taken along line XL-XL in FIG. 39.

Next, as shown in FIGS. 39 and 40, a plurality of conductive bonding materials 67 is coated on the main surface electrodes 611 and 612 of the semiconductor chip 601. In this embodiment, an example of the conductive bonding materials 67 may include solder.

Figure 41:
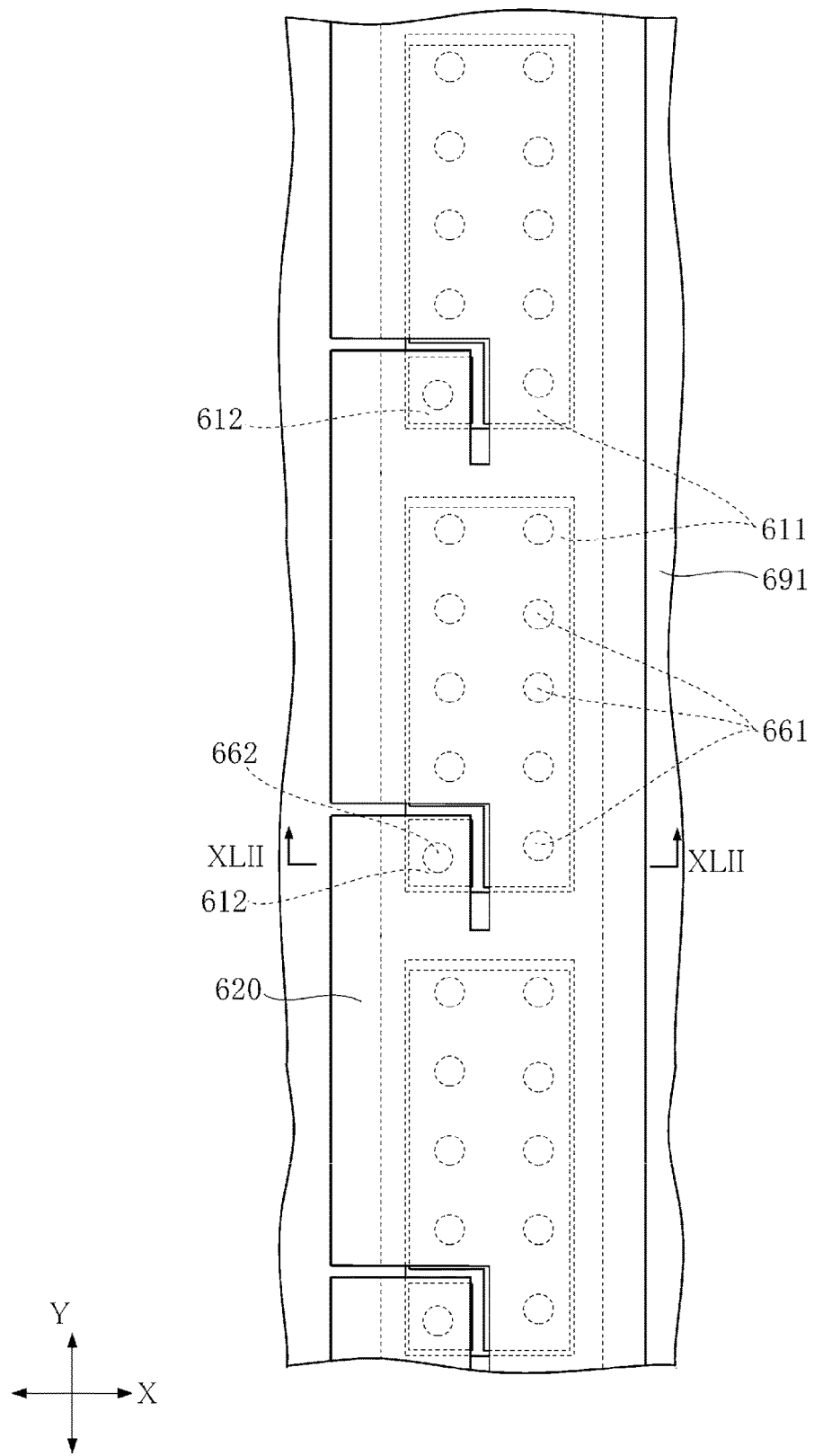
FIG. 41 is a main part plan view showing a process subsequent to FIG. 39.
Figure 42:
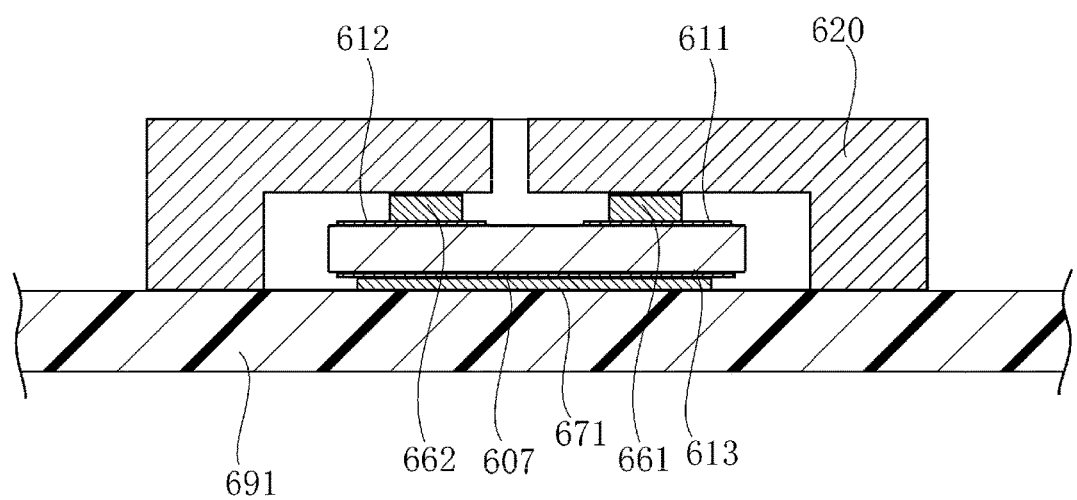
FIG. 42 is a main part sectional view taken along line XLII-XLII in FIG. 41.

Next, as shown in FIGS. 41 and 42, the lead 620 is placed on the semiconductor chip 601. Specifically, the lead 620 is placed at a position at which it overlaps with the main surface electrodes 611 and 612 of the semiconductor chip 601 when viewed in the direction Z and is then bonded to the tape 691. The lead 620 has a shape extending in the direction Y.

Then, the intermediate product on which the lead 620 is placed is heated in a reflow furnace. Thus, the lead 620 is bonded to the main surface electrodes 611 and 612. Through the bonding process of the lead 620, the conductive bondings 661 and 662 are formed from the conductive bonding materials 667.

Figure 43:
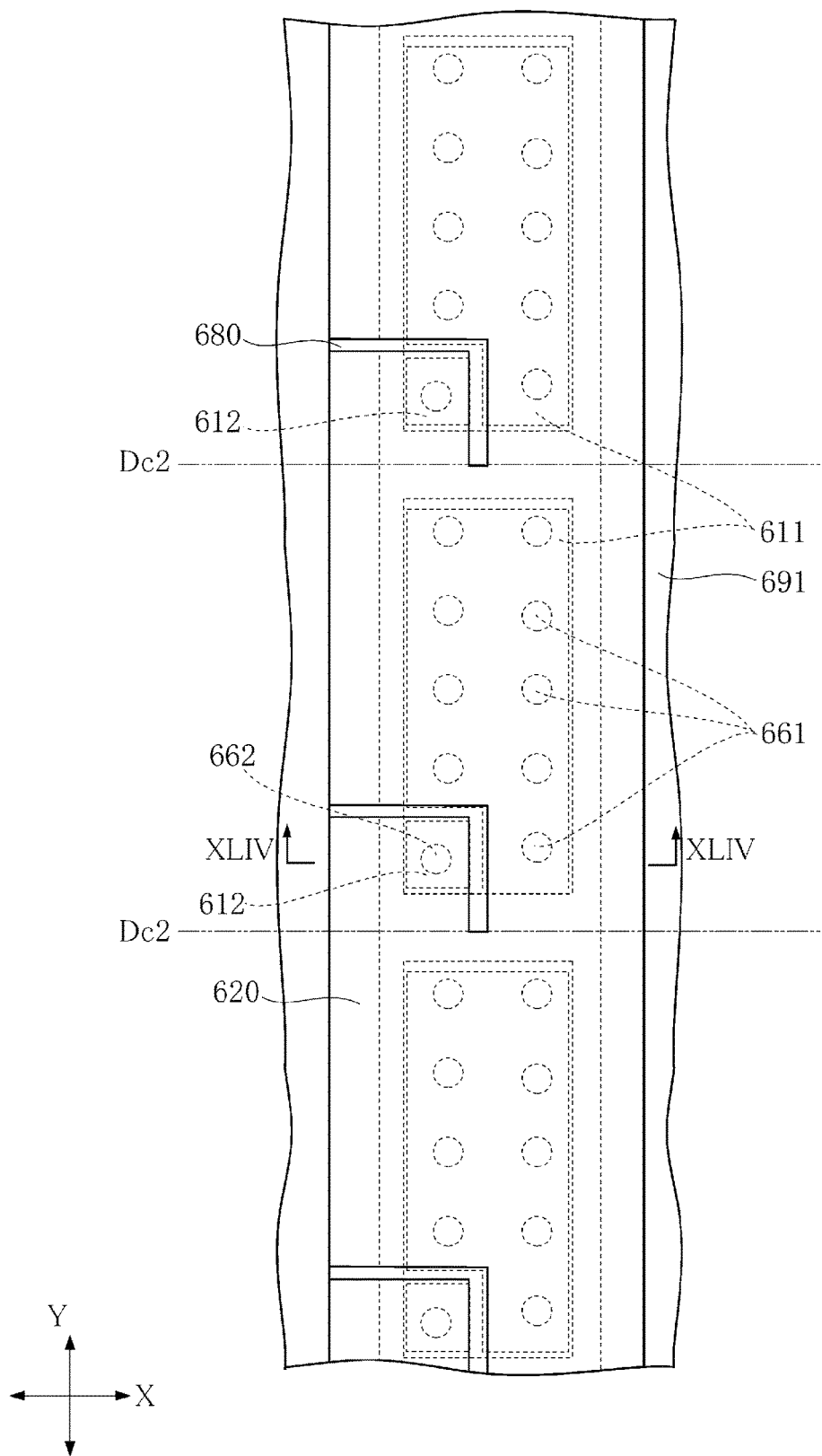
FIG. 43 is a main part plan view showing a process subsequent to FIG. 41.
Figure 44:
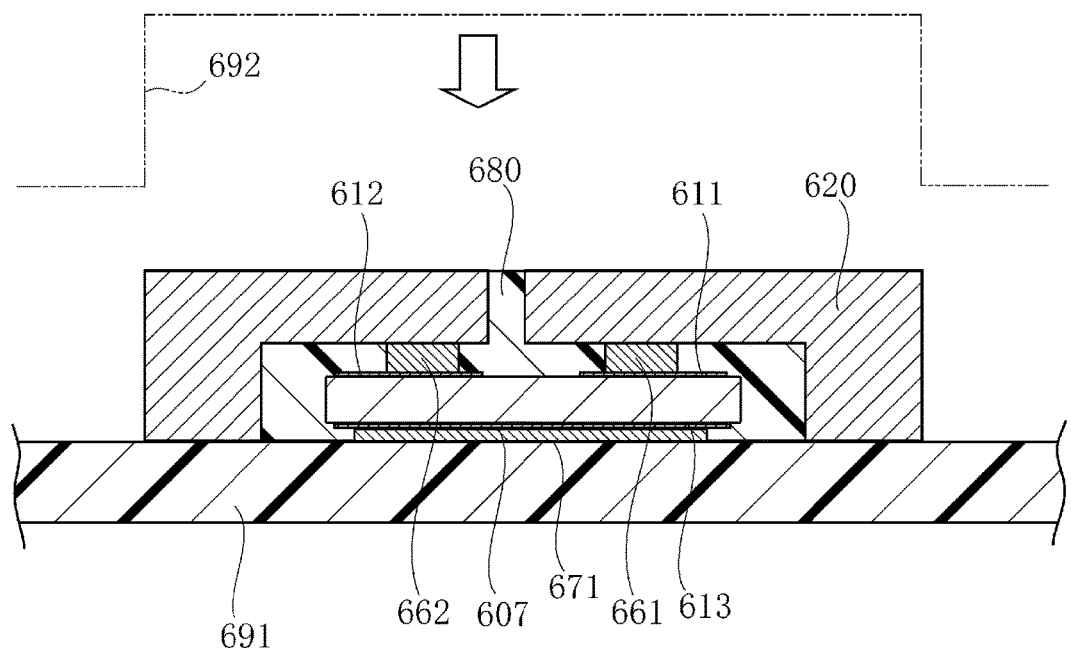
FIG. 44 is a main part sectional view taken along line XLIV-XLIV in FIG. 43.

Next, as shown in FIGS. 43 and 44, the resin portion 680 is formed. The resin portion 680 is formed under the condition where the semiconductor chip 601, the lead 620 and the conductive bondings 661 and 662 are accommodated by a mold 692 and the tape 691. Then, the tape 691 is peeled off of the semiconductor chip 601, the lead 620 and the resin portion 680. Then, the lead 620 and the resin portion 680 are cut out along a line Dc2, thereby completing the semiconductor device 200 shown in FIG. 30.

Next, the operation and effects of this embodiment will be described.

The semiconductor device 200 includes the conductive layer 607 exposed from the resin bottom 681. The conductive layer 607 makes direct contact with the electrode surface 618 of the rear electrode 613. With this configuration, the conductive layer 607 may be formed separately from the semiconductor chip 601 including the rear surface electrode 613. Accordingly, the conductive layer 607 may be formed to have a desired shape without being limited to the shape of the rear surface electrode 613. For example, in this embodiment, the conductive layer 607 is formed to have an area smaller than the area of the semiconductor chip 601 when viewed in the direction Z. If the area of the conductive layer 607 when viewed in the direction Z is smaller than the area of the semiconductor chip 601 when viewed in the direction Z, a solder layer connected to the conductive layer 607 can be prevented from contacting the solder layer 208 bonded to the lead 602 when the semiconductor device 200 is mounted on the circuit board 106. This can prevent the conductive layer 607 making electrical conduction with the rear surface electrode 613 from making electrical conduction with the solder layer 208. Similarly, this can prevent the conductive layer 607 from making electrical conduction with the solder layer 209.

In the semiconductor device 200, the lead sides 623 and 624 are exposed from the resin portion 608. This makes it easy to emit heat generated in the semiconductor chip 601 out of the semiconductor device 200. In addition, for improvement of moisture resistance of the semiconductor device 200, the lead sides 623 and 624 may be covered with the resin portion 608.

In the semiconductor device 200, the lead side 633 is exposed from the resin portion 608. This also makes it easy to emit heat generated in the semiconductor chip 601 out of the semiconductor device 200.

<First Modification of Semiconductor Device according to Second Embodiment>

A first modification of the semiconductor device of the second embodiment will be now described with reference to FIG. 45.

Figure 45:
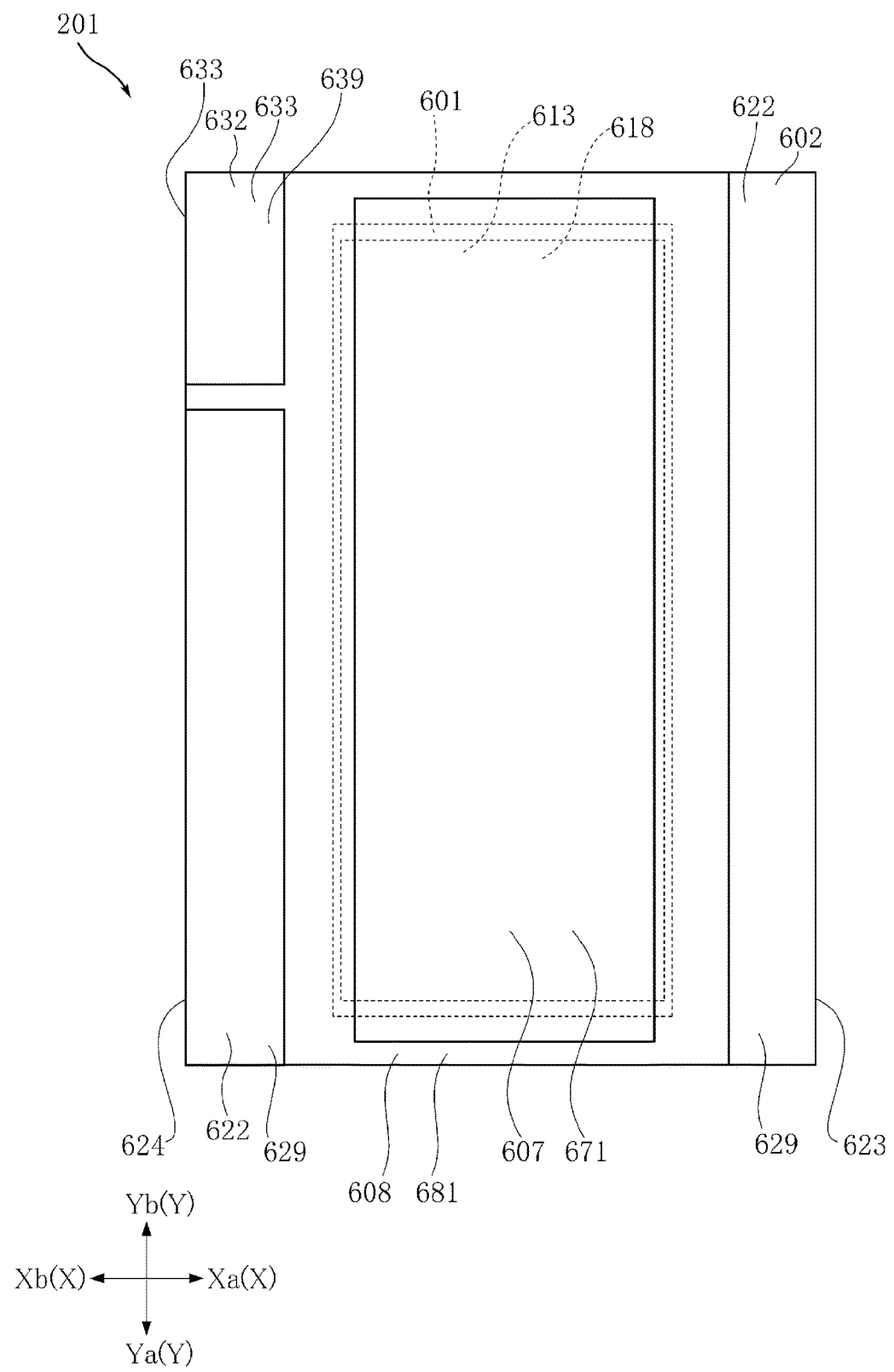
FIG. 45 is a bottom view of the semiconductor device according to a first modification of the second embodiment.
Figure 46:
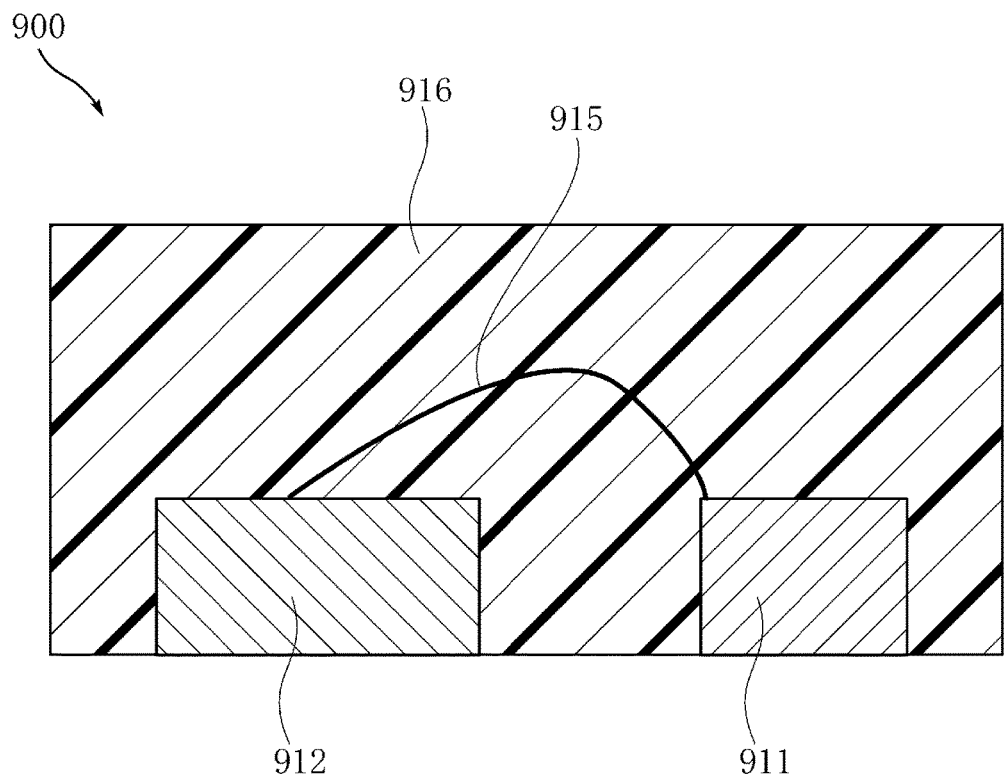
FIG. 46 is a sectional view of one example of a conventional semiconductor device.
Figure 47:
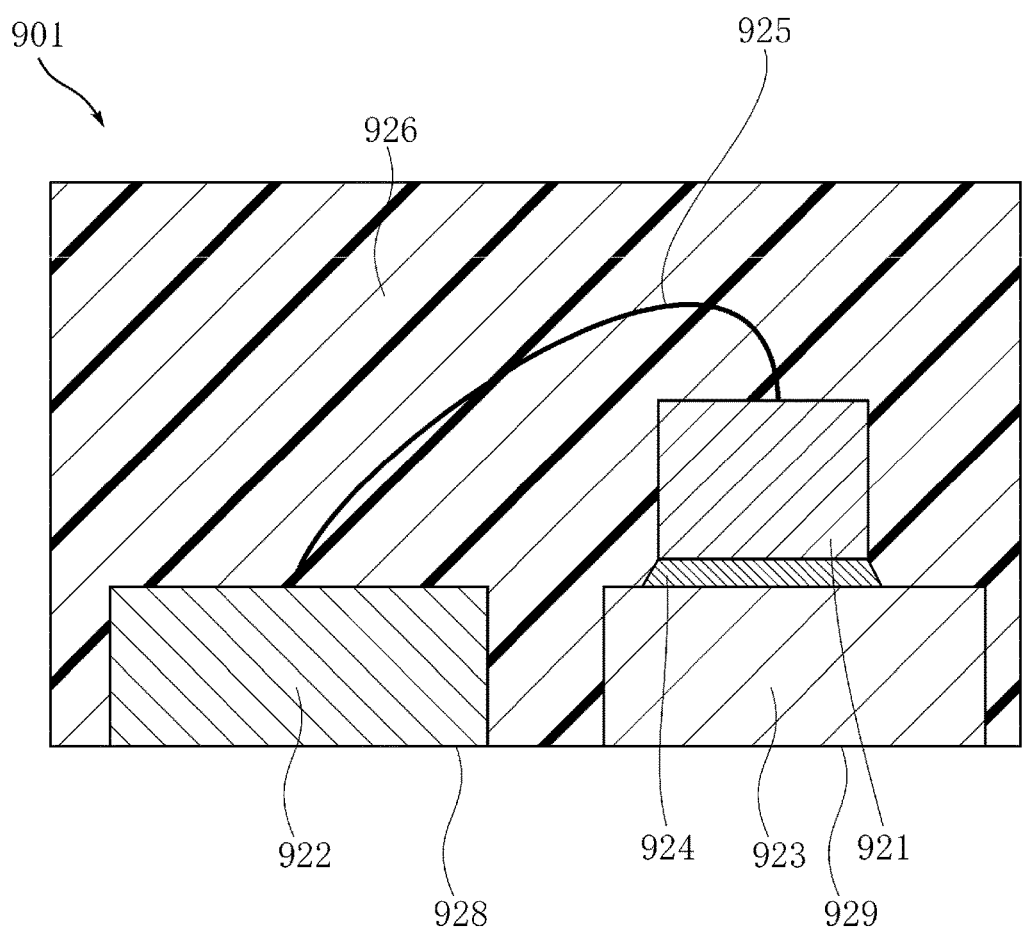
FIG. 47 is a sectional view of another example of a conventional semiconductor device.

FIG. 45 is a bottom view of a semiconductor device according to this modification.

A semiconductor device 201 shown in FIG. 45 is different from the semiconductor device 200 in terms of the shape of the conductive layer 607 when viewed in the direction Z. In this modification, the area of the conductive layer 607 when viewed in the direction Z is larger than the area of the semiconductor chip 601 when viewed in the direction Z. Accordingly, the conductive layer 607 projects from the semiconductor chip 601 in the directions Ya and Yb when viewed in the direction Z. Like the semiconductor device 200, also in this modification, the conductive layer 607 overlaps with the semiconductor chip 601 when viewed in the direction Z.

Also in this modification, the conductive layer 607 may be formed separately from the semiconductor chip 601 including the rear surface electrode 613. Accordingly, the conductive layer 607 may be formed to have a desired shape without being limited to the shape of the rear surface electrode 613. For example, in this modification, the conductive layer 607 is formed to have an area larger than the area of the semiconductor chip 601 when viewed in the direction Z. If the area of the conductive layer 607 when viewed in the direction Z is larger than the area of the semiconductor chip 601 when viewed in the direction Z, heat generated in the semiconductor chip 601 can be rapidly emitted out of the semiconductor device 201.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device, comprising:
a semiconductor chip including a first main surface electrode having a first electrode surface facing a first direction, a second main surface electrode having a third electrode surface facing the first direction, and a rear surface electrode having a third electrode surface facing a second direction opposite to the first direction;

a first lead having a first portion and two second portions, the first portion and the second portions being integrated as a single body with the first portion being interposed between the two second portions, wherein the first portion overlaps with the semiconductor chip in the first direction and each of the two second portions includes a first lead bottom facing the second direction;

a first conductive bonding located between the first electrode surface and the lead and bonds the first electrode surface to the first lead;

a second lead having a third portion overlapping with the semiconductor chip in the first direction, and including a second lead bottom facing the second direction;

a second conductive bonding located between the second electrode surface and the second lead and bonds the second electrode surface to the second lead;

a conductive layer which makes direct contact with the third electrode surface; and a resin portion which covers the semiconductor chip, the first lead, the second lead, and the conductive layer, wherein the first lead bottom and the second lead bottom are exposed from the resin portion, and the conductive layer is exposed from the resin portion, and wherein top surfaces of the first portion and the two second portions form a lead main surface of the first lead and side surfaces of the two second portions form two lead sides of the first lead, and the lead main surface and the two lead sides are exposed and not covered by the resin portion.

2. The semiconductor device of claim 1, wherein the semiconductor chip projects from the conductive layer when viewed in the second direction.

3. The semiconductor device of claim 1, wherein an area of the conductive layer when viewed in the second direction is smaller than an area of the semiconductor chip when viewed in the second direction.

4. The semiconductor device of claim 1, wherein an area of the conductive layer when viewed in the second direction is larger than an area of the semiconductor chip when viewed in the second direction.

5. The semiconductor device of claim 1, wherein the resin portion includes a resin main surface located between the first lead and the second lead.

6. The semiconductor device of claim 1, wherein the second lead includes a lead side exposed from the resin portion.

7. The semiconductor device of claim 1, wherein a dimension of the first portion is smaller than a dimension of each of the two second portions when viewed in the second direction.

* * * * *